(12) United States Patent
Sheeks et al.

(10) Patent No.: US 10,985,576 B2
(45) Date of Patent: Apr. 20, 2021

(54) BATTERY PACK

(71) Applicant: MILWAUKEE ELECTRIC TOOL CORPORATION, Brookfield, WI (US)

(72) Inventors: Samuel Sheeks, Germantown, WI (US); Jeffrey M. Brozek, Mequon, WI (US); Matthew J. Mergener, Mequon, WI (US); Ryan B. Jipp, Brookfield, WI (US)

(73) Assignee: Milwaukee Electric Tool Corporation, Brookfield, WI (US)

(*) Notice: Subject to any disclaimer, the term of this patent is extended or adjusted under 35 U.S.C. 154(b) by 173 days.

(21) Appl. No.: 15/865,878

(22) Filed: Jan. 9, 2018

(65) Prior Publication Data

US 2018/0198101 A1 Jul. 12, 2018

Related U.S. Application Data

(60) Provisional application No. 62/526,295, filed on Jun. 28, 2017, provisional application No. 62/523,716, (Continued)

(51) Int. Cl.
*H01M 10/617* (2014.01)
*H01M 10/643* (2014.01)
(Continued)

(52) U.S. Cl.
CPC .......... *H02J 7/0026* (2013.01); *G01R 31/392* (2019.01); *H01M 2/105* (2013.01);
(Continued)

(58) Field of Classification Search
None
See application file for complete search history.

(56) References Cited

U.S. PATENT DOCUMENTS 3,609,504 A 9/1971 Barker et al.
3,947,743 A 3/1976 Mabuchi et al.
(Continued)

FOREIGN PATENT DOCUMENTS

CN 203056041 7/2013
CN 104347911 2/2015
(Continued)

OTHER PUBLICATIONS

International Search Report and Written Opinion for Application No. PCT/US2018/012920 dated Jul. 20, 2018, 28 pages.
(Continued)

*Primary Examiner* — Tracy M Dove
(74) *Attorney, Agent, or Firm* — Michael Best & Friedrich LLP

(57) ABSTRACT

A battery pack, a method of heating a battery cell and an electrical combination. The battery pack may include a housing; a battery cell; a heating element operable to provide heat to the battery cell; a temperature sensing device operable to sense a temperature of an interior of the battery pack; a heating switch operable to control whether power is provided to the heating element; and an electronic processor configured to receive a signal from the temperature sensing device, the signal indicating the temperature of the interior of the battery pack, determine that the temperature of the interior of the battery pack is less than a predetermined temperature threshold, and in response to determining that the temperature of the interior of the battery pack is less than the predetermined temperature threshold, close the heating switch to provide power to the heating element.

15 Claims, 19 Drawing Sheets

Related U.S. Application Data filed on Jun. 22, 2017, provisional application No. 62/519,713, filed on Jun. 14, 2017, provisional application No. 62/443,899, filed on Jan. 9, 2017.

(51) Int. Cl.

| | | |
|---|---|---|
| *H02J 7/26* | (2006.01) | |
| *H02J 7/00* | (2006.01) | |
| *H01M 2/10* | (2006.01) | |
| *H01M 10/6235* | (2014.01) | |
| *H01M 10/6554* | (2014.01) | |
| *G01R 31/392* | (2019.01) | |
| *H01M 10/44* | (2006.01) | |
| *H01M 2/30* | (2006.01) | |
| *H01M 10/652* | (2014.01) | |
| *H01M 10/6557* | (2014.01) | |
| *G01R 31/396* | (2019.01) | |

(52) U.S. Cl.
CPC ....... *H01M 2/1016* (2013.01); *H01M 2/1077* (2013.01); *H01M 10/443* (2013.01); *H01M 10/617* (2015.04); *H01M 10/6235* (2015.04); *H01M 10/643* (2015.04); *H01M 10/6554* (2015.04); *H02J 7/0029* (2013.01); *H02J 7/0045* (2013.01); *H02J 7/0091* (2013.01); *H02J 7/007192* (2020.01); *G01R 31/396* (2019.01); *H01M 2/30* (2013.01); *H01M 10/652* (2015.04); *H01M 10/6557* (2015.04)

(56) References Cited

U.S. PATENT DOCUMENTS

| | | | |
|---|---|---|---|
| 4,702,563 A | 10/1987 | Parker | |
| 4,926,106 A | 5/1990 | Tanis | |
| 5,055,656 A | 10/1991 | Farah et al. | |
| 5,391,974 A | 2/1995 | Shiojima et al. | |
| 5,399,445 A | 3/1995 | Tinker | |
| 5,477,126 A | 12/1995 | Shiojima | |
| 5,477,127 A | 12/1995 | Shiojima et al. | |
| 5,483,145 A | 1/1996 | Shiojima et al. | |
| 5,488,300 A | 1/1996 | Jamieson | |
| 5,497,068 A | 3/1996 | Shiojima | |
| 5,742,148 A | 4/1998 | Sudo et al. | |
| 5,818,201 A | 10/1998 | Stockstad et al. | |
| 5,828,203 A | 10/1998 | Lindeboom et al. | |
| 5,831,350 A | 11/1998 | McConkey et al. | |
| 5,841,265 A | 11/1998 | Sudo et al. | |
| 5,874,825 A | 2/1999 | Brotto | |
| 5,880,575 A | 3/1999 | Itou et al. | |
| 5,912,544 A | 6/1999 | Miyakawa et al. | |
| 5,969,625 A | 10/1999 | Russo | |
| 5,990,660 A | 11/1999 | Meissner | |
| 5,994,873 A | 11/1999 | Shiojima | |
| 5,998,974 A | 12/1999 | Sudo et al. | |
| 6,002,240 A | 12/1999 | McMahan et al. | |
| 6,020,721 A | 2/2000 | Brotto | |
| 6,037,778 A | 3/2000 | Makhija | |
| 6,051,955 A | 4/2000 | Saeki et al. | |
| 6,054,841 A | 4/2000 | Sudo et al. | |
| 6,087,807 A | 7/2000 | Sudo et al. | |
| 6,097,177 A | 8/2000 | Sudo et al. | |
| 6,127,808 A | 10/2000 | Sudo et al. | |
| 6,181,108 B1 | 1/2001 | Sudo et al. | |
| 6,242,890 B1 | 6/2001 | Sudo et al. | |
| 6,337,559 B1 | 1/2002 | Sato | |
| 6,433,514 B1 | 8/2002 | McClure | |
| 6,624,611 B2 | 9/2003 | Kirmuss | |
| 6,700,351 B2 | 3/2004 | Blair et al. | |
| 6,700,766 B2 | 3/2004 | Sato | |
| 7,327,122 B2 | 2/2008 | Kamenoff | |
| 7,365,952 B2 | 4/2008 | Sato | |
| 7,453,235 B2 | 11/2008 | Blair et al. | |
| 7,456,614 B2 | 11/2008 | Sato et al. |
| 7,528,581 B2 | 5/2009 | Miyazaki et al. |
| 7,619,391 B2 | 11/2009 | Loong |
| 7,622,897 B2 | 11/2009 | Eberhard et al. |
| 7,626,359 B2 | 12/2009 | Imai |
| 7,649,340 B2 | 1/2010 | Sato et al. |
| 7,656,126 B2 | 2/2010 | Sato |
| 7,683,570 B2 | 3/2010 | Krauer et al. |
| 7,733,059 B2 | 6/2010 | Yoshida |
| 7,777,451 B2 | 8/2010 | Chang et al. |
| 7,782,013 B2 | 8/2010 | Chang |
| 7,808,207 B1 | 10/2010 | Chang |
| 7,821,231 B1 | 10/2010 | Chang et al. |
| 7,825,632 B1 | 11/2010 | Chang |
| 7,847,522 B2 | 12/2010 | Tashiro et al. |
| 7,884,577 B2 | 2/2011 | Tsutsumi et al. |
| 7,944,218 B2 | 5/2011 | Oglesbee et al. |
| 7,963,814 B2 | 6/2011 | Grimmeisen |
| 8,058,842 B2 | 11/2011 | Kai et al. |
| 8,088,331 B2 | 1/2012 | Ueda et al. |
| 8,103,401 B2 | 1/2012 | Kubo et al. |
| 8,115,455 B2 | 2/2012 | Sellin et al. |
| 8,144,021 B2 | 3/2012 | Page |
| 8,148,946 B2 | 4/2012 | Takeda et al. |
| 8,159,184 B2 | 4/2012 | Emori et al. |
| 8,159,191 B2 | 4/2012 | Chang et al. |
| 8,163,411 B2 | 4/2012 | Mizoguchi et al. |
| 8,183,833 B2 | 5/2012 | Kobayashi |
| 8,183,835 B2 | 5/2012 | Takeda et al. |
| 8,207,704 B2 | 6/2012 | Kai et al. |
| 8,217,625 B2 | 7/2012 | Chang et al. |
| 8,338,012 B2 | 12/2012 | Gaben et al. |
| 8,350,528 B2 | 1/2013 | Yang et al. |
| 8,395,358 B2 | 3/2013 | Gaben et al. |
| 8,401,728 B2 | 3/2013 | Kubo et al. |
| 8,417,403 B2 | 4/2013 | Iida et al. |
| 8,582,268 B2 | 11/2013 | Yamamoto et al. |
| 8,643,341 B2 | 2/2014 | Hamaguchi et al. |
| 8,649,935 B2 | 2/2014 | Kubo et al. |
| 8,723,527 B2 | 5/2014 | Kudo et al. |
| 8,872,482 B2 | 10/2014 | Jung |
| 8,896,271 B2 | 11/2014 | Kim et al. |
| 8,952,701 B2 | 2/2015 | Jang et al. |
| 8,975,870 B2 | 3/2015 | Maruyama et al. |
| 9,008,902 B2 | 4/2015 | Kubo et al. |
| 9,030,167 B2 | 5/2015 | Yamaguchi et al. |
| 9,071,056 B2 | 6/2015 | Yang et al. |
| 9,077,054 B2 | 7/2015 | Hanai et al. |
| 9,130,379 B2 | 9/2015 | Sakabe et al. |
| 9,136,509 B2 | 9/2015 | Tam et al. |
| 9,142,981 B2 | 9/2015 | Kamata et al. |
| 9,153,846 B2 | 10/2015 | Liang et al. |
| 9,263,900 B2 | 2/2016 | Ju et al. |
| 9,287,728 B2 | 3/2016 | Odaohhara et al. |
| 9,306,248 B2 | 4/2016 | Yang et al. |
| 9,324,625 B2 | 4/2016 | Ahlers et al. |
| 9,333,874 B2 | 5/2016 | Kubo et al. |
| 9,337,669 B2 | 5/2016 | Boda et al. |
| 9,337,680 B2 | 5/2016 | Gibeau et al. |
| 9,340,121 B2 | 5/2016 | Schwarz et al. |
| 9,356,451 B2 | 5/2016 | Kawahara et al. |
| 9,356,461 B2 | 5/2016 | Howard et al. |
| 9,431,687 B2 | 8/2016 | Bonebright et al. |
| 9,469,202 B2 | 10/2016 | Miglioranza |
| 9,474,171 B2 | 10/2016 | Maglietta et al. |
| 9,509,152 B2 | 11/2016 | Peh et al. |
| 9,511,673 B2 | 12/2016 | Rill et al. |
| 9,523,740 B2 | 12/2016 | Okumura et al. |
| 9,525,289 B2 | 12/2016 | Yoshida |
| 9,599,677 B2 | 3/2017 | Maeba et al. |
| 9,627,723 B2 | 4/2017 | Wang et al. |
| 9,634,518 B2 | 4/2017 | Miglioranza |
| 9,673,657 B2 | 6/2017 | van Lammeren et al. |
| 9,768,625 B2 | 9/2017 | Sakakibara |
| 9,776,517 B2 | 10/2017 | Sakata et al. |
| 9,837,811 B2 | 12/2017 | Yamaguchi et al. |
| 9,853,330 B2 | 12/2017 | Matthe et al. |
| 9,866,049 B2 | 1/2018 | Kim et al. |
| 9,874,592 B2 | 1/2018 | Nakai |

(56) References Cited

U.S. PATENT DOCUMENTS

| | | |
|---|---|---|
| 9,956,889 B2 | 5/2018 | Park |
| 10,008,752 B1 | 6/2018 | Chan |
| 10,069,311 B2 | 9/2018 | Sugeno et al. |
| 10,084,334 B1 | 9/2018 | Dao et al. |
| 10,096,863 B2 | 10/2018 | Hartmeyer et al. |
| 10,128,670 B2 | 11/2018 | Ban et al. |
| 10,193,194 B2 | 1/2019 | Nakatsuka et al. |
| 10,259,338 B2 | 4/2019 | Bryngelsson et al. |
| 10,276,706 B2 | 4/2019 | Ahlers et al. |
| 10,330,732 B2 | 6/2019 | Roumi et al. |
| 10,347,952 B2 | 7/2019 | Choi et al. |
| 10,408,864 B2 | 9/2019 | Yamaguchi et al. |
| 10,439,196 B2 | 10/2019 | Bourns et al. |
| 10,442,309 B2 | 10/2019 | Goetz |
| 2001/0033502 A1 | 10/2001 | Blair et al. |
| 2003/0044689 A1 | 3/2003 | Miyazaki et al. |
| 2004/0004464 A1 | 1/2004 | Tsukamoto et al. |
| 2004/0160214 A1 | 8/2004 | Blair et al. |
| 2004/0178768 A1 | 9/2004 | Miyazaki et al. |
| 2005/0073282 A1 | 4/2005 | Carrier et al. |
| 2005/0127873 A1 | 6/2005 | Yamamoto et al. |
| 2005/0156566 A1 | 7/2005 | Thorsoe et al. |
| 2005/0156578 A1 | 7/2005 | Kamenoff |
| 2005/0242775 A1 | 11/2005 | Miyazaki et al. |
| 2006/0001403 A1 | 1/2006 | Yudahira |
| 2006/0028167 A1 | 2/2006 | Czubay et al. |
| 2007/0018613 A1 | 1/2007 | Miyazaki et al. |
| 2007/0126407 A1 | 6/2007 | Loong |
| 2007/0164710 A1 | 7/2007 | Sato |
| 2007/0252558 A1 | 11/2007 | Kawano et al. |
| 2007/0275296 A1 | 11/2007 | Ueda et al. |
| 2008/0061740 A1 | 3/2008 | Miyazaki et al. |
| 2008/0067978 A1 | 3/2008 | Miyazaki et al. |
| 2008/0079395 A1 | 4/2008 | Miyazaki et al. |
| 2008/0143298 A1 | 6/2008 | Yoshida |
| 2009/0051323 A1 | 2/2009 | Sato et al. |
| 2009/0072793 A1 | 3/2009 | Chang et al. |
| 2009/0085516 A1 | 4/2009 | Emori et al. |
| 2009/0102421 A1 | 4/2009 | Imai |
| 2009/0130542 A1 | 5/2009 | Mizoguchi et al. |
| 2009/0167253 A1 | 7/2009 | Muraoka et al. |
| 2009/0169987 A1 | 7/2009 | Miyazaki et al. |
| 2009/0198399 A1 | 8/2009 | Kubo et al. |
| 2009/0230923 A1 | 9/2009 | Hoffman et al. |
| 2009/0261781 A1 | 10/2009 | Miyazaki et al. |
| 2009/0284223 A1 | 11/2009 | Miyazaki et al. |
| 2009/0284224 A1 | 11/2009 | Miyazaki et al. |
| 2009/0302802 A1 | 12/2009 | Miyazaki et al. |
| 2010/0072947 A1 | 3/2010 | Chan et al. |
| 2010/0090652 A1 | 4/2010 | Takeda et al. |
| 2010/0134069 A1 | 6/2010 | Oosawa et al. |
| 2010/0253278 A1 | 10/2010 | Chang et al. |
| 2010/0253285 A1 | 10/2010 | Takahashi et al. |
| 2010/0270972 A1 | 10/2010 | Chang et al. |
| 2010/0283428 A1 | 11/2010 | Chang et al. |
| 2011/0050175 A1 | 3/2011 | Odaohhara et al. |
| 2011/0074362 A1 | 3/2011 | Midorikawa |
| 2011/0121787 A1 | 5/2011 | Kim et al. |
| 2011/0127945 A1 | 6/2011 | Yoneda |
| 2011/0316486 A1 | 12/2011 | Inaba et al. |
| 2012/0001595 A1 | 1/2012 | Maruyama et al. |
| 2012/0025144 A1 | 2/2012 | Lee et al. |
| 2012/0056598 A1 | 3/2012 | Kim et al. |
| 2012/0094151 A1 | 4/2012 | Kim |
| 2012/0132286 A1 | 5/2012 | Lim et al. |
| 2012/0133370 A1 | 5/2012 | Kubo et al. |
| 2012/0181956 A1 | 7/2012 | Rossel |
| 2012/0200261 A1 | 8/2012 | Rossel |
| 2012/0242290 A1 | 9/2012 | Asakura |
| 2012/0286734 A1 | 11/2012 | Miyazaki et al. |
| 2012/0299555 A1 | 11/2012 | Tam et al. |
| 2012/0313562 A1 | 12/2012 | Murao et al. |
| 2013/0004802 A1 | 1/2013 | Robertson |
| 2013/0108894 A1 | 5/2013 | Jung |
| 2013/0113280 A1 | 5/2013 | Yang et al. |
| 2013/0127423 A1 | 5/2013 | Liang et al. |
| 2013/0141828 A1 | 6/2013 | Yamaguchi et al. |
| 2013/0181826 A1 | 7/2013 | Yang et al. |
| 2013/0187659 A1 | 7/2013 | Kubo et al. |
| 2013/0249494 A1 | 9/2013 | Ju et al. |
| 2013/0260196 A1 | 10/2013 | Takahashi et al. |
| 2013/0270249 A1 | 10/2013 | Suzuki et al. |
| 2013/0293198 A1 | 11/2013 | Nakashima et al. |
| 2014/0015511 A1 | 1/2014 | Matthe et al. |
| 2014/0084933 A1 | 3/2014 | Jang et al. |
| 2014/0088823 A1 | 3/2014 | Kubo et al. |
| 2014/0159671 A1 | 6/2014 | Kawahara et al. |
| 2014/0203781 A1 | 7/2014 | Yun |
| 2014/0210415 A1 | 7/2014 | Ohmori |
| 2014/0225574 A1 | 8/2014 | Boda et al. |
| 2014/0239904 A1 | 8/2014 | Tanaka et al. |
| 2014/0320140 A1 | 10/2014 | Maeba et al. |
| 2014/0333267 A1 | 11/2014 | Crawley |
| 2014/0336964 A1 | 11/2014 | Okumura et al. |
| 2015/0035495 A1 | 2/2015 | Yoshida |
| 2015/0084597 A1 | 3/2015 | Kim et al. |
| 2015/0191102 A1 | 7/2015 | Kubo et al. |
| 2015/0266392 A1 | 9/2015 | Arai et al. |
| 2015/0288036 A1 | 10/2015 | Hartmeyer et al. |
| 2015/0318589 A1 | 11/2015 | Keating et al. |
| 2015/0321577 A1 | 11/2015 | Murata |
| 2016/0036100 A1 | 2/2016 | Wang et al. |
| 2016/0359207 A1 | 12/2016 | Cornelius et al. |
| 2017/0057376 A1 | 3/2017 | Murata |
| 2017/0063117 A1 | 3/2017 | Ban |
| 2017/0085107 A1 | 3/2017 | Rastegar et al. |
| 2017/0108552 A1 | 4/2017 | Roumi et al. |
| 2017/0120775 A1 | 5/2017 | Murata et al. |
| 2017/0131363 A1 | 5/2017 | Scott et al. |
| 2017/0166078 A1 | 6/2017 | Elie et al. |
| 2017/0179462 A1 | 6/2017 | Bourns et al. |
| 2017/0179713 A1 | 6/2017 | Bourns et al. |
| 2017/0250549 A1 | 8/2017 | Jin |
| 2017/0288425 A1 | 10/2017 | Fukushima |
| 2017/0346334 A1 | 11/2017 | Mergener et al. |
| 2018/0041052 A1 | 2/2018 | Nakamto et al. |
| 2018/0041054 A1 | 2/2018 | Nakamto et al. |
| 2018/0048165 A1 | 2/2018 | Shiraishi |
| 2018/0095141 A1 | 4/2018 | Wild et al. |
| 2018/0175429 A1 | 6/2018 | Gottlieb et al. |
| 2018/0203075 A1 | 7/2018 | Lee et al. |
| 2018/0254640 A1 | 9/2018 | Jung et al. |
| 2018/0262021 A1 | 9/2018 | Kim et al. |
| 2018/0306845 A1 | 10/2018 | Yamaguchi et al. |
| 2018/0316036 A1 | 11/2018 | Song et al. |
| 2018/0358819 A1 | 12/2018 | Hellgren et al. |
| 2019/0025382 A1 | 1/2019 | Yamada |
| 2019/0033390 A1 | 1/2019 | Yamada |
| 2019/0094311 A1 | 3/2019 | Yamada |
| 2019/0204393 A1 | 7/2019 | Yamada |
| 2019/0212397 A1 | 7/2019 | Yamada |
| 2019/0288520 A1 | 9/2019 | Abdel-Monem et al. |
| 2019/0334356 A1 | 10/2019 | Hidaka |

FOREIGN PATENT DOCUMENTS

| | | |
|---|---|---|
| CN | 105071501 | 11/2015 |
| CN | 205509550 | 8/2016 |
| CN | 205646068 | 10/2016 |
| CN | 106252788 | 12/2016 |
| DE | 19614435 | 10/1997 |
| DE | 102010000268 | 8/2011 |
| EP | 2608308 | 6/2013 |
| JP | 2006286508 | 10/2006 |
| JP | 2017037775 A | 2/2017 |
| KR | 20150006147 | 1/2015 |
| KR | 20150033126 | 4/2015 |
| WO | 9617397 | 6/1996 |
| WO | 9931752 | 6/1999 |
| WO | 2011122946 | 10/2011 |

(56) References Cited

FOREIGN PATENT DOCUMENTS

WO   2015149186 A1   10/2015
WO   2016157405 A1   10/2016

OTHER PUBLICATIONS

United States Patent Office Non Final Office Action for U.S. Appl. No. 15/865,764 dated Nov. 14, 2019 (18 pages).
United States Patent Office Notice of Allowance for U.S. Appl. No. 15/865,764 dated Mar. 12, 2020 (10 pages).
Australian Patent Office Examination Report No. 1 for Application No. 2018205364 dated May 13, 2020 (4 pages).
European Patent Office Extended Search Report for Application No. 18735819.7 dated Aug. 24, 2020 (11 pages).
Korean Patent Office Action for Application No. 20-2019-7000062 dated Dec. 28, 2020 (8 pages including statement of relevance).

BATTERY PACK

RELATED APPLICATIONS

The present application claims priority to U.S. Provisional Application No. 62/443,899, filed Jan. 9, 2017; U.S. Provisional Application No. 62/519,713, filed Jun. 14, 2017; U.S. Provisional Application No. 62/523,716, filed Jun. 22, 2017; and U.S. Provisional Application No. 62/526,295, filed Jun. 28, 2017, the entire contents of all of which are hereby incorporated by reference.

FIELD OF THE INVENTION

The present invention relates to battery packs and, more specifically, to battery packs that can be charged in cold weather and/or operated to inhibit battery pack failure.

SUMMARY

Battery packs power various types of equipment or devices that may be used in cold environments (for example, in temperatures below 0° Celsius (32° Fahrenheit)). For example, such devices may include power tools, outdoor tools, snow blowers, lighting equipment, etc. In some cases, because of the chemistry of the battery cells (for example, lithium-based battery cells), the battery pack may not be able to be charged when the temperature is below a predetermined temperature threshold. To prevent potential damage to the battery cells, many battery packs include control circuitry to prevent the battery pack from being charged when the temperature of the battery cells is below the predetermined temperature threshold (for example, 0° C.). However, in some situations, it may be desirable to be able charge the battery pack when the temperature is below the predetermined temperature threshold.

In one independent aspect, a battery pack may include a housing; a battery cell supported in the housing and electrically connectable to an electrical device, power being transferrable between the battery cell and the electrical device; and one or more heating elements supported in the housing and operable to heat the battery cell.

In some embodiments, the heating element(s) may be in direct contact with the battery cell. In some embodiments, the heating element(s) may increase the temperature of the battery cell from below a predetermined temperature threshold to meet or exceed the predetermined temperature threshold in a time period (e.g., approximately six minutes). In such embodiments, full charging current can be drawn by the battery pack in environments in which the temperature is below the predetermined temperature threshold at the end of the time period after the battery pack is coupled to a charger.

Alternatively, the battery pack may be heated externally (e.g., using a charger) to allow the battery pack to be charged when the temperature is below the predetermined temperature threshold. Such an external heating method may, in some instances, take longer than desired to warm the battery pack to a temperature that allows the battery pack to be charged. Additionally, it may be difficult to couple the external heating element (e.g., to the battery pack housing) to provide sufficient thermal transfer to warm the battery pack and the battery cell(s) above the predetermined temperature threshold. Furthermore, when using an external heating method, a thermistor measuring the temperature of the battery cells may determine that the temperature has reached the predetermined temperature threshold before the battery cells have actually reached the predetermined temperature threshold.

In yet another alternative, the battery pack may include battery cells with a lower predetermined temperature threshold for charging to allow the battery pack to be charged when the temperature is below the predetermined temperature threshold. However, such battery cells may have a lower capacity and cycle life compared to battery cells with a higher predetermined temperature threshold for charging.

In a further alternative, the battery pack may be charged with a low charging current when the temperature is below the predetermined temperature threshold to allow the battery pack to be charged. However, such a low current charging method may only allow charging in temperatures above −10° C. (14° F.) and may increase the charging time of the battery pack by up to three times compared to the charging time when the temperature is above the predetermined temperature threshold.

In one independent aspect, a battery pack may generally include a housing; a battery cell supported in the housing and electrically connectable to an electrical device, power being transferrable between the battery cell and the electrical device; a heating element supported in the housing and operable to provide heat to the battery cell; a temperature sensing device supported in the housing and operable to sense a temperature of an interior of the battery pack; a heating switch operable to control whether power is provided to the heating element; and an electronic processor coupled to the temperature sensing device and the heating switch. The electronic processor may be configured to receive a signal from the temperature sensing device, the signal indicating the temperature of the interior of the battery pack, determine that the temperature of the interior of the battery pack is less than a predetermined temperature threshold, and in response to determining that the temperature of the interior of the battery pack is less than the predetermined temperature threshold, close the heating switch to provide power to the heating element.

In another independent aspect, a method of heating a battery cell may be provided. The battery cell may be supported in a housing of a battery pack and electrically connectable to an electrical device, power being transferrable between the battery cell and the electrical device. The method may generally include monitoring, with a temperature sensing device supported in the housing, a temperature of an interior of the battery pack; receiving, with an electronic processor, a signal from the temperature sensing device, the signal indicating the temperature of the interior of the battery pack; determining, with the electronic processor, that the temperature of the interior of the battery pack is less than a predetermined temperature threshold; and controlling, with the electronic processor and in response to determining that the temperature of the interior of the battery pack is less than the predetermined temperature threshold, a heating switch to close to provide power to a heating element supported in the housing, the heating element being operable to heat the battery cell.

In yet another independent aspect, an electrical combination may generally include a battery pack including a housing, a battery cell supported in the housing and electrically connectable to an electrical device, a heating element supported in the housing and operable to heat the battery cell, and a heating switch operable to control whether power is provided to the heating element; a charger configured to electrically couple to the battery pack, power being suppliable from the charger to the battery pack to charge the battery cell; a temperature sensing device operable to sense a temperature relative to the battery pack; and an electronic processor coupled to the heating switch. The electronic processor may be configured to receive a signal from the temperature sensing device, the signal indicating the temperature, determine that the temperature is less than a predetermined temperature threshold, and close the heating switch to provide power to the heating element in response to determining that the temperature is less than the predetermined temperature threshold.

In a further independent aspect, a battery pack may generally include a housing; a battery cell supported in the housing and electrically connectable to an electrical device, power being transferrable between the battery cell and the electrical device; a heating element supported in the housing and operable to provide heat to the battery cell; a heating switch operable to control whether power is provided to the heating element; and an electronic processor coupled the heating switch. The electronic processor may be configured to receive a signal indicating a temperature relative to the battery pack determine that the temperature is less than a predetermined temperature threshold, and, in response to determining that the temperature is less than the predetermined temperature threshold, close the heating switch to provide power to the heating element.

In another independent aspect, a method of heating a battery cell may be provided. The battery cell may be supported in a housing of a battery pack and electrically connectable to an electrical device, power being transferrable between the battery cell and the electrical device. The method may generally include receiving, with an electronic processor, a signal indicating a temperature relative to the battery pack; determining, with the electronic processor, that the temperature is less than a predetermined temperature threshold; and controlling, with the electronic processor and in response to determining that the temperature is less than the predetermined temperature threshold, a heating switch to close to provide power to a heating element, the heating element operable to provide heat to the battery cell.

In another alternative, the battery pack may be monitored for a failure condition, and, when a failure condition is detected, one or more battery cells of the battery pack may be discharged through one or more resistors in the battery pack. In some constructions, the battery pack may include a thermistor operable to sense a temperature of a battery cell, and, when the temperature is above a threshold, the battery cell may be discharged through the resistors. The battery pack may include a second thermistor operable to sense a temperature of a second battery cell and, when a difference between a temperature of the first battery cell and the second battery cell is above a threshold, the first battery cell and the second battery cell are discharged through the resistors.

In another alternative, the battery pack may be monitored for a failure condition, and, when a failure condition is detected, one or more battery cells of the battery pack may be discharged through one or more resistors in the battery pack. In some constructions, the battery pack may include conductive plates that are used to detect an ingress fluid in the battery pack and monitor a conductivity of the ingress fluid. When the conductivity of the ingress fluid is determined to be above a threshold, one or more battery cells may be isolated from each other and other battery cells may be discharged through the resistors. Strings of parallel battery cells may be discharged one string at a time in some embodiments. In some embodiments, isolated strings of battery cells may be self-discharged.

In another alternative, the battery pack may be monitored for a failure condition, and, when a failure condition is detected, the battery pack may notify a user that the failure condition has been detected. One or more battery cells of the battery pack may then be discharged through one or more resistors in an external resistor bank attachment that is coupled to the terminals of the battery pack.

In yet another alternative, the battery pack may be monitored for multiple types of failure conditions and may execute different amelioration techniques based on the determined type of failure condition. In some embodiments, the battery pack may shut down to prevent operation in response to an over-temperature, overcharge, under-temperature, or undercharge condition of the battery pack. In some embodiments, the battery pack may discharge one or more strings of battery cells through internal or external resistors or by isolating one or more strings of battery cells in response to an over-temperature condition of an individual battery cell (or group of battery cells) or detection of conductive ingress fluid within the battery pack.

In another independent embodiment, a battery pack may generally include a housing; a battery cell supported in the housing and electrically connectable to an electrical device, power being transferrable between the battery cell and the electrical device; a resistor supported in the housing and operable to receive current from the battery cell; and an electronic processor configured to detect a failure condition of the battery pack, and, in response to detecting the failure condition of the battery pack, cause the battery cell to discharge through the resistor.

In yet another independent embodiment, a method of inhibiting failure of a battery pack may be provided. The battery pack may include a housing, a battery cell supported in the housing, power being transferrable between the battery cell and an electrical device, and a resistor supported in the housing and operable to receive current from the battery cell. The method may generally include detecting, with an electronic processor, a failure condition of the battery pack; and controlling, with the electronic processor and in response to detecting the failure condition of the battery pack, a switch to discharge the battery cell through the resistor.

In a further independent aspect, a battery pack may generally include a housing; a first string of battery cells supported in the housing and electrically connectable to an electrical device, power being transferrable between the first string of battery cells and the electrical device; a second string of battery cells supported in the housing and electrically connectable to the electrical device, power being transferrable between the second string of battery cells and the electrical device, the second string of battery cells being connected in parallel with the first string of battery cells; a resistor supported in the housing and connected in parallel with the first string of battery cells and the second string of battery cells; a first switch electrically between the resistor and the first string of battery cells and the second string of battery cells; a plurality of second switches, each second switch being located between a battery cell of the first string of battery cells and the second string of battery cells; and an electronic processor coupled to the first switch and the plurality of second switches. The electronic processor may be configured to detect a failure condition of the battery pack, and, in response to detecting the failure condition, control the plurality of second switches to open to isolate the second string of battery cells from the first string of battery cells, and control the first switch to close to discharge the first string of battery cells through the resistor.

In another independent aspect, a battery pack may generally include a housing; a battery cell supported in the housing and electrically connectable to an electrical device, power being transferrable between the battery cell and the electrical device; a resistor supported in the housing and operable to receive current from the battery cell; a switch operable to control whether current from the battery cell is provided to the resistor; and an electronic processor coupled to the switch and configured to control the switch to supply current from the battery cell to the resistor.

Other independent aspects of the invention may become apparent by consideration of the detailed description and accompanying drawings.

DETAILED DESCRIPTION

Before any independent embodiments of the invention are explained in detail, it is to be understood that the invention is not limited in its application to the details of construction and the arrangement of components set forth in the following description or illustrated in the following drawings. The invention is capable of other independent embodiments and of being practiced or of being carried out in various ways. Also, it is to be understood that the phraseology and terminology used herein is for the purpose of description and should not be regarded as limiting.

Use of "including" and "comprising" and variations thereof as used herein is meant to encompass the items listed thereafter and equivalents thereof as well as additional items. Use of "consisting of" and variations thereof as used herein is meant to encompass only the items listed thereafter and equivalents thereof.

Also, the functionality described herein as being performed by one component may be performed by multiple components in a distributed manner. Likewise, functionality performed by multiple components may be consolidated and performed by a single component. Similarly, a component described as performing particular functionality may also perform additional functionality not described herein. For example, a device or structure that is "configured" in a certain way is configured in at least that way but may also be configured in ways that are not listed.

In addition, it should be understood that embodiments of the invention may include hardware, software, and electronic components or modules that, for purposes of discussion, may be illustrated and described as if the majority of the components were implemented solely in hardware. However, based on a reading of the detailed description, it should be recognized that, in at least one embodiment, electronic-based aspects may be implemented in software (e.g., instructions stored on non-transitory computer-readable medium) executable by one or more processing units, such as a microprocessor and/or application specific integrated circuits ("ASICs"). As such, it should be noted that a plurality of hardware and software-based devices, as well as a plurality of different structural components may be utilized to implement the aspects. For example, "servers" and "computing devices" described in the specification can include one or more processing units, one or more computer-readable medium modules, one or more input/output interfaces, and various connections (e.g., a system bus) connecting the components.

FIGS. 1A-1D illustrate a battery pack 105 that may be used to provide power to electrical equipment or devices that may be used in cold environments, for example, in temperatures below 0° C. (32° F.). The electrical device (not shown) may include a power tool (for example, a drill, a saw, a pipe cutter, an impact wrench, etc.), outdoor tool (for example, a snow blower, a vegetation cutter, etc.), lighting equipment, a power source, etc.

Figure 1A:
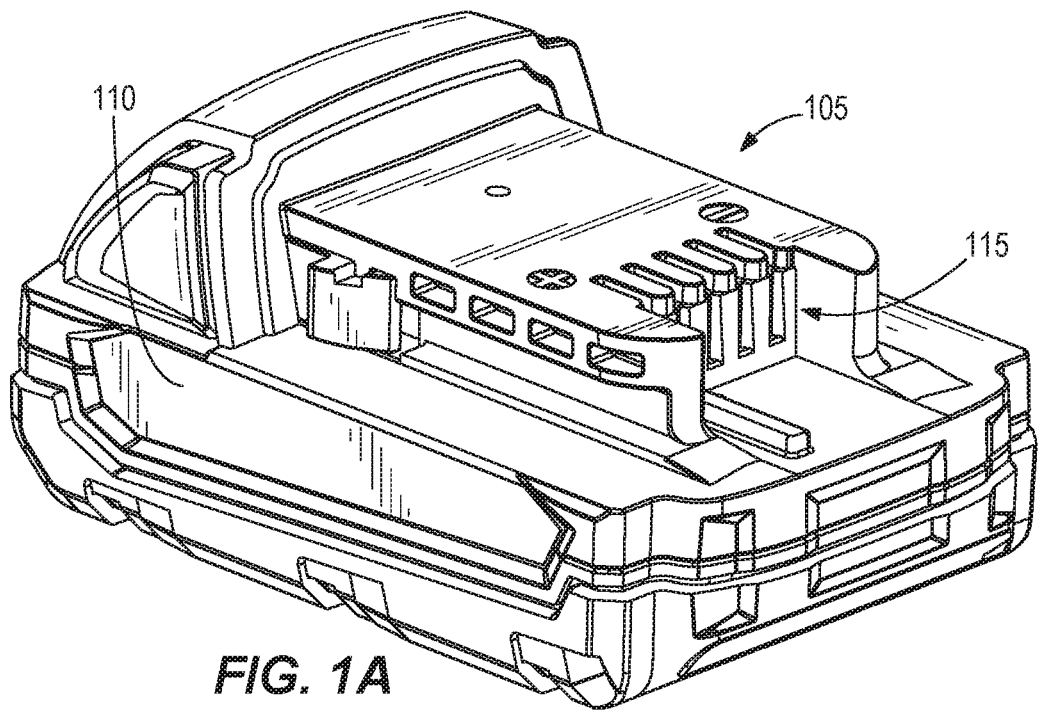
FIGS. 1A-1D are perspective views of a battery pack that may be used in cold environments.

As shown in FIG. 1A, the battery pack 105 includes a battery pack housing 110. The housing 110 includes a plurality of openings that allow battery pack terminals 115 to mechanically and electrically couple the battery pack 105 to the power tool. In some embodiments, the battery pack terminals 115 may include a power line, a ground line, and one more communication lines.

Figure 1B:
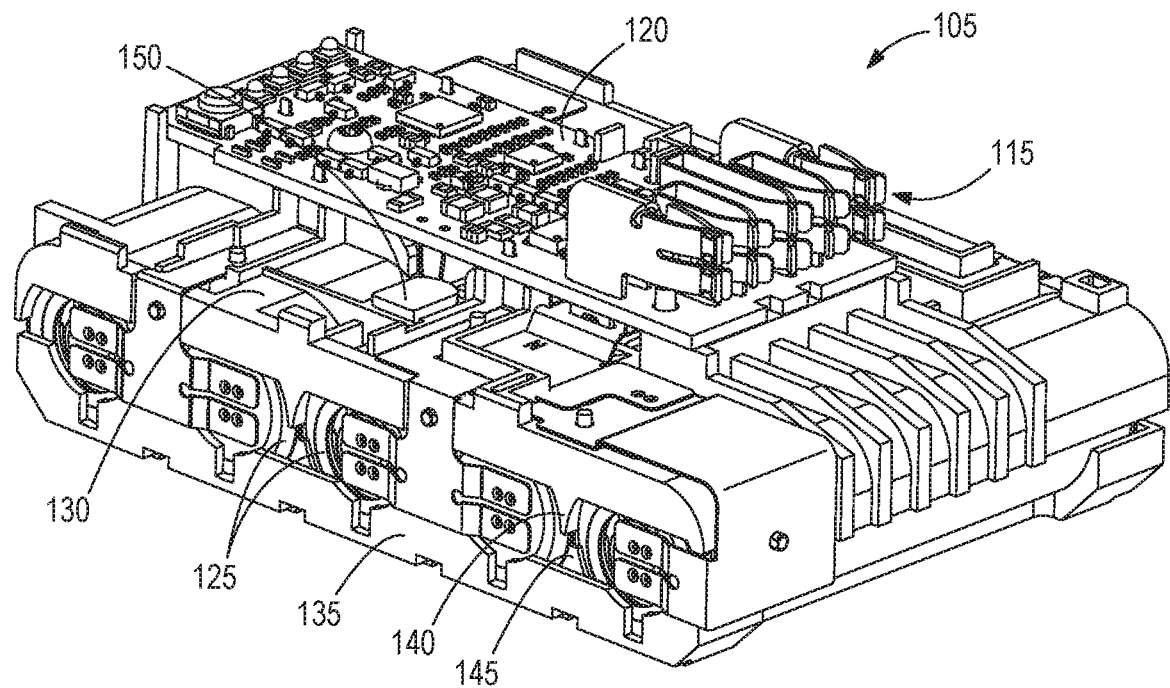

In FIG. 1B, the housing 110 is removed to expose internal components of the battery pack 105. As shown in FIG. 1B, a printed circuit board (PCB) 120 includes the battery pack terminals 115 and control circuitry (see FIGS. 4A-4B) to control operation of the battery pack 105, as explained in greater detail below.

As shown in FIGS. 1A-1D, the illustrated battery pack 105 includes a single row of five battery cells 125. In other constructions, the battery pack 105 may include (see, e.g., FIGS. 2A-2D) more than one row of battery cells 125 and/or the row(s) may include fewer or more than five battery cells 125 (not shown).

The battery cells 125 are held in place by a top case 130 and a bottom case 135. Wedge elements 140, 145 protrude from the respective cases 130, 135 to contact an outer surface of the battery cells 125 (for example, to hold the battery cells 125 in place). The cases 130, 135 surround the side surfaces of the battery cells 125 but leave the ends of the battery cells 125 exposed to allow them to be electrically coupled in a circuit.

A temperature sensing device such as a thermistor 150 (see FIG. 1B) is electrically coupled to the PCB 120 (for example, using conductors, wires, etc.) to provide signals to the control circuitry corresponding to or representing a temperature of the interior of the battery pack 105 (e.g., a temperature of the battery cells 125). The thermistor 150 is mounted on the top case 130 and monitors the temperature of the battery cells 125 through a hole in the top case 130 (see FIG. 1D). In alternate embodiments (not shown), the thermistor 150 may be located in alternate locations, such as underneath the battery cells 125 mounted on the bottom case 135.

Figure 1C:
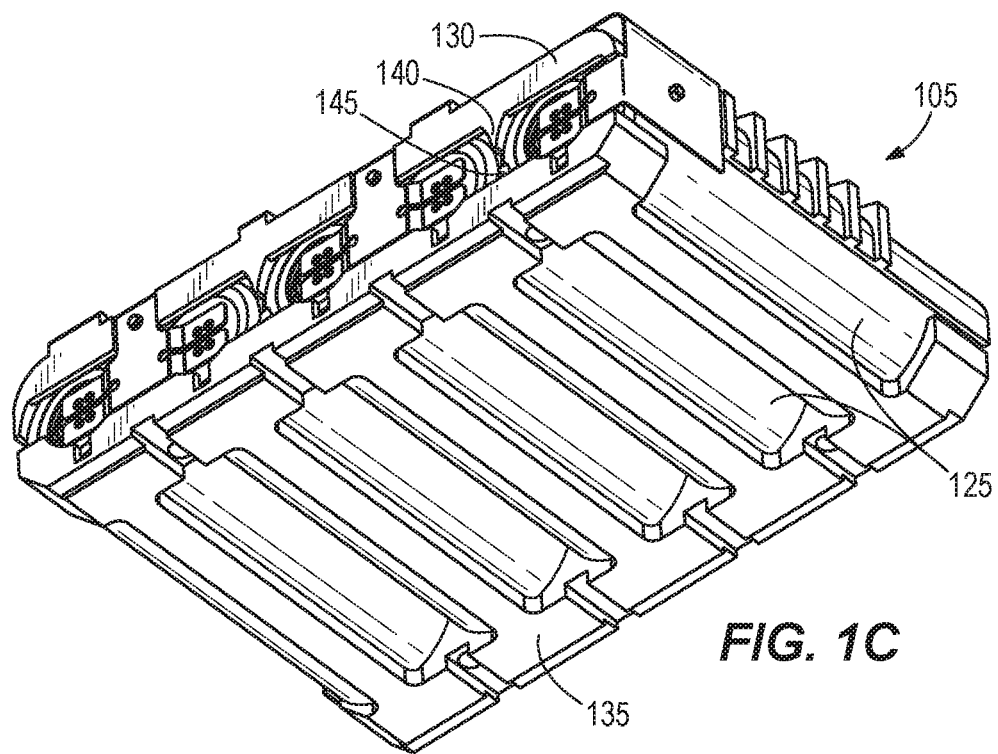
Figure 1D:
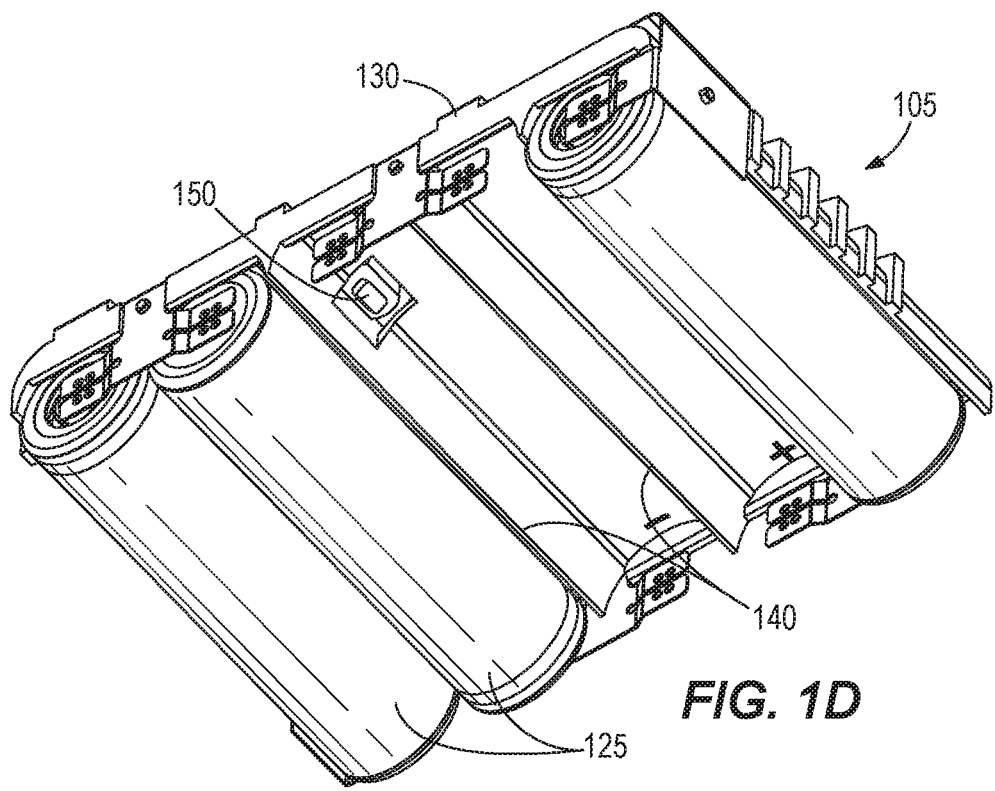

In FIGS. 1B and 1D, the thermistor 150 is positioned above the middle battery cell 125. In other embodiments (not shown), the thermistor 150 may be located in alternate locations, such as above or below one of the other battery cells 125. In some embodiments (not shown), the battery pack 105 may include two or more thermistors 150. For example, the battery pack 105 may include a first thermistor located above the left-most battery cell 125 and a second thermistor located above the right-most battery cell 125.

In FIG. 1C, the housing 110 is removed, and, in FIG. 1D, the housing 110, the bottom case 135, and two battery cells 125 have been removed. As mentioned above and as shown in FIG. 1D, the top case 130 includes a hole to allow the thermistor 150 to monitor the temperature of the battery cells 125.

FIGS. 2A-2D illustrate another construction of a battery pack 205 that may be used to provide power to electrical equipment or devices that may be used in cold environments, described above. The battery pack 205 is similar to the battery pack 105 described above, and common elements have the same reference number plus "100".

The following description will focus on aspects of the battery pack 205 different than the battery pack 105. It should be noted, however, that features of battery pack 205 may be incorporated or substituted into the battery pack 205, or vice versa.

As shown in FIGS. 2A-2D, the battery pack 205 includes two rows of five battery cells 225. In other constructions, the battery pack 205 may include (see, e.g., FIGS. 1A-1D) one row of battery cells or more than two rows of battery cells 125 (not shown) and/or the row(s) may include fewer or more than five battery cells 125 (not shown).

The battery cells 225 are held in place by an interior case 230 that surrounds side surfaces of the battery cells 225 but leaves ends of the battery cells 225 exposed to allow them to be electrically coupled in a circuit.

Spacers 237 are provided between each pair of battery cells 225 to further hold the battery cells 225 in place. Each spacer 237 extends from one end of an associated pair of battery cells 225 to the other end and makes contact with the side surfaces of the associated pair of battery cells 225.

Figure 2A:
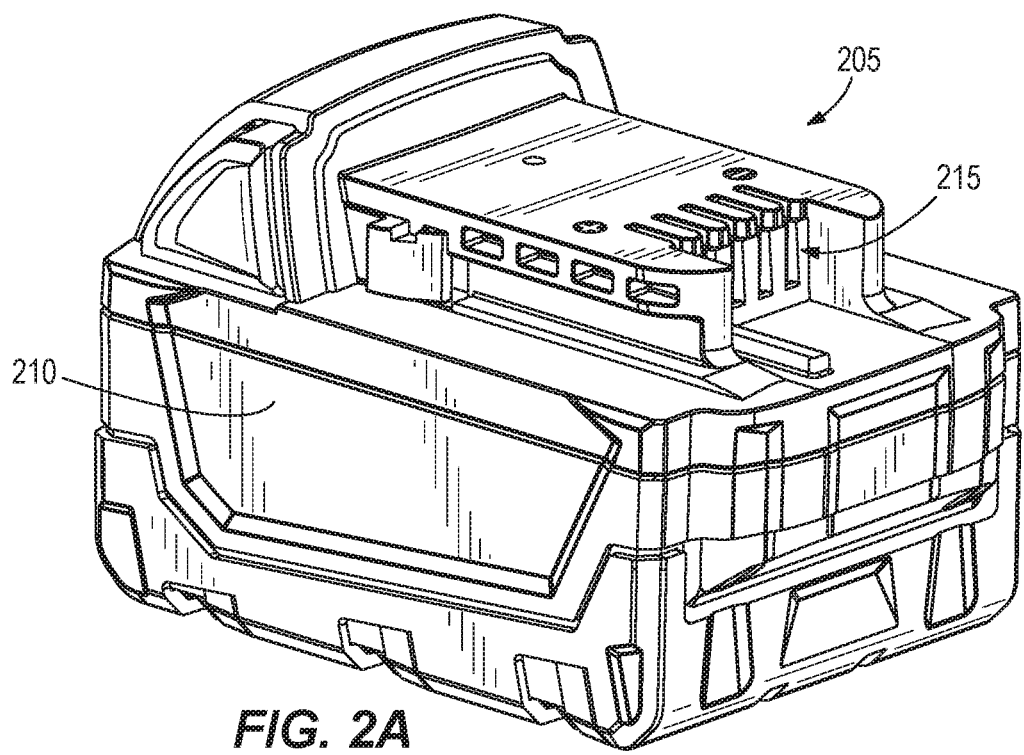
FIGS. 2A-2D are perspective views of another battery pack that may be used in cold environments.
Figure 2B:
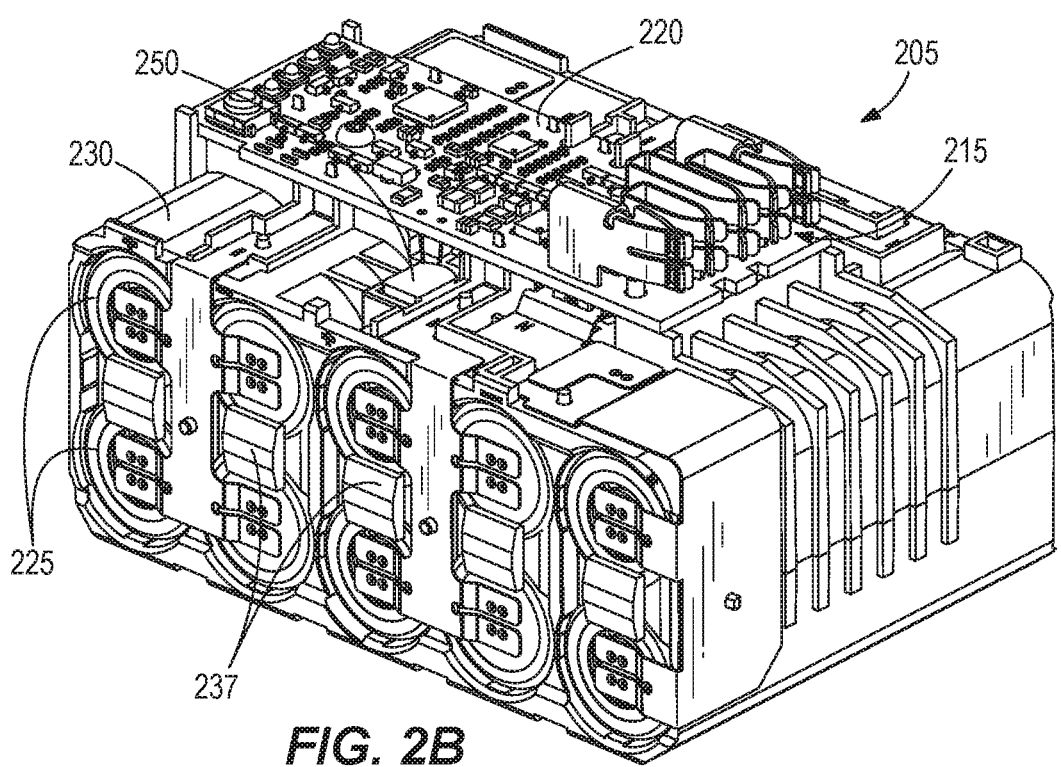
Figure 2C:
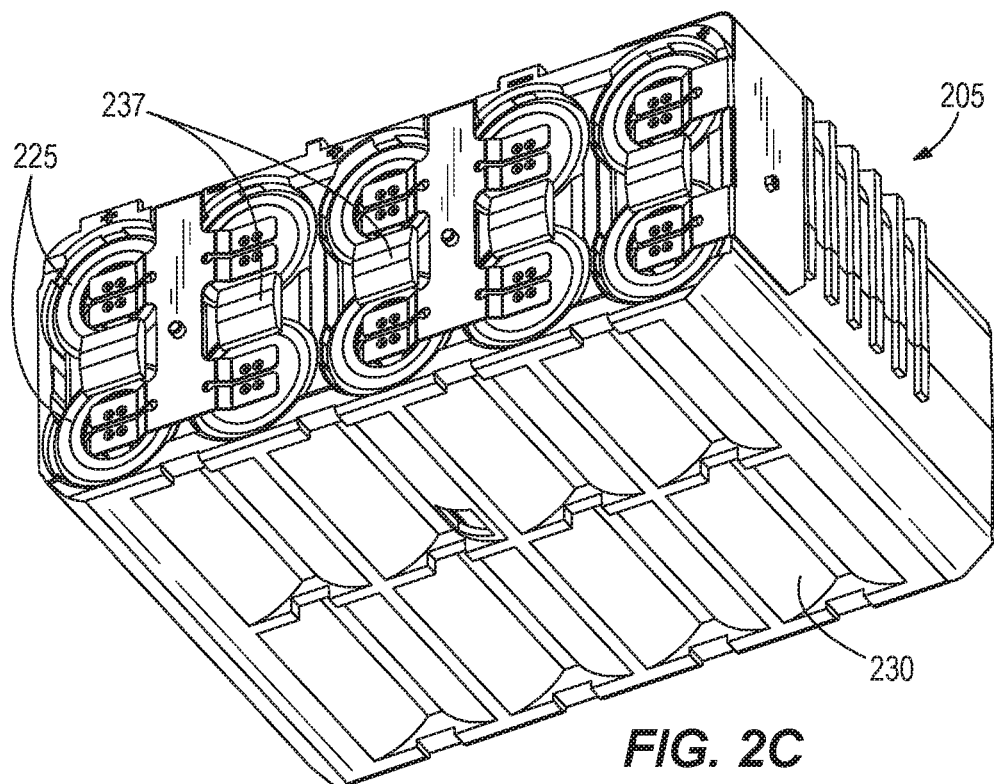
Figure 2D:
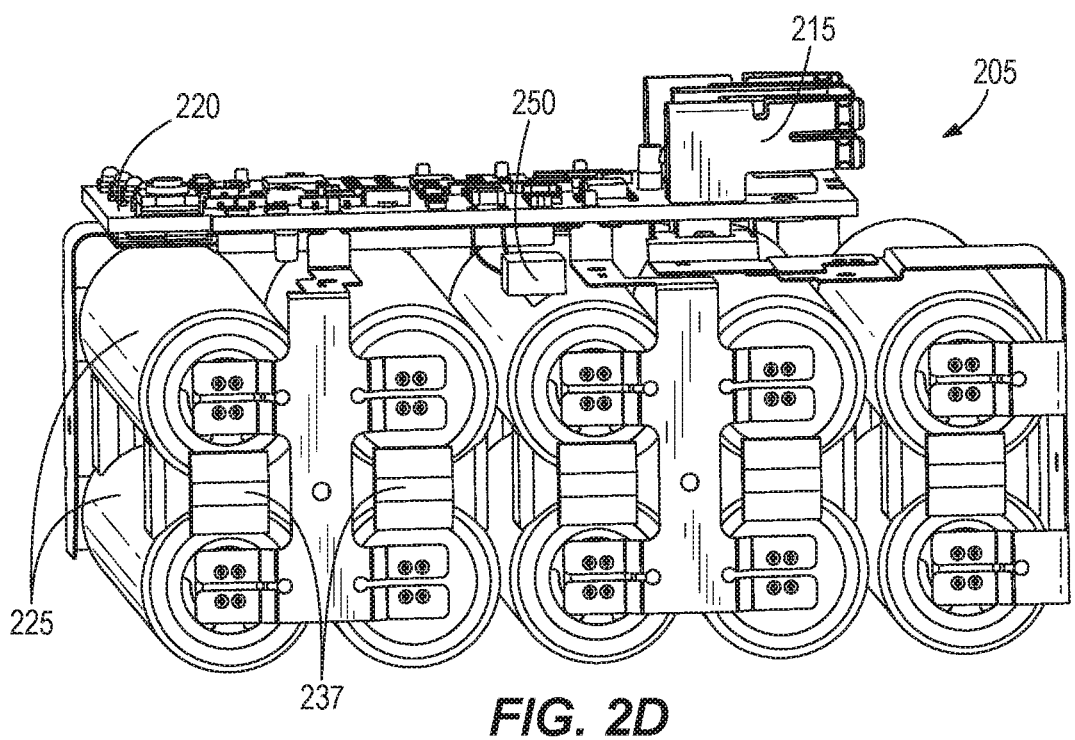

Although FIG. 2B shows an individual spacer 237 for each pair of battery cells 225, in some embodiments (not shown), multiple spacers 237 (e.g., all five illustrated spacers 237) may be formed into a single unit (in other words, a planar spacer with wedge elements similar to the wedge elements 140 and 145 of the battery pack 105).

The battery pack 205 includes a thermistor 250 electrically coupled to the PCB 220. As shown in FIG. 2B, the thermistor 250 is mounted on top of the interior case 230 and monitors the temperature of the battery cells 225 through a hole in the top of the interior case 230. In other constructions (not shown), the thermistor 250 may be positioned in another location such as between rows of battery cells 225, on a spacer 235, etc.

Figure 3:
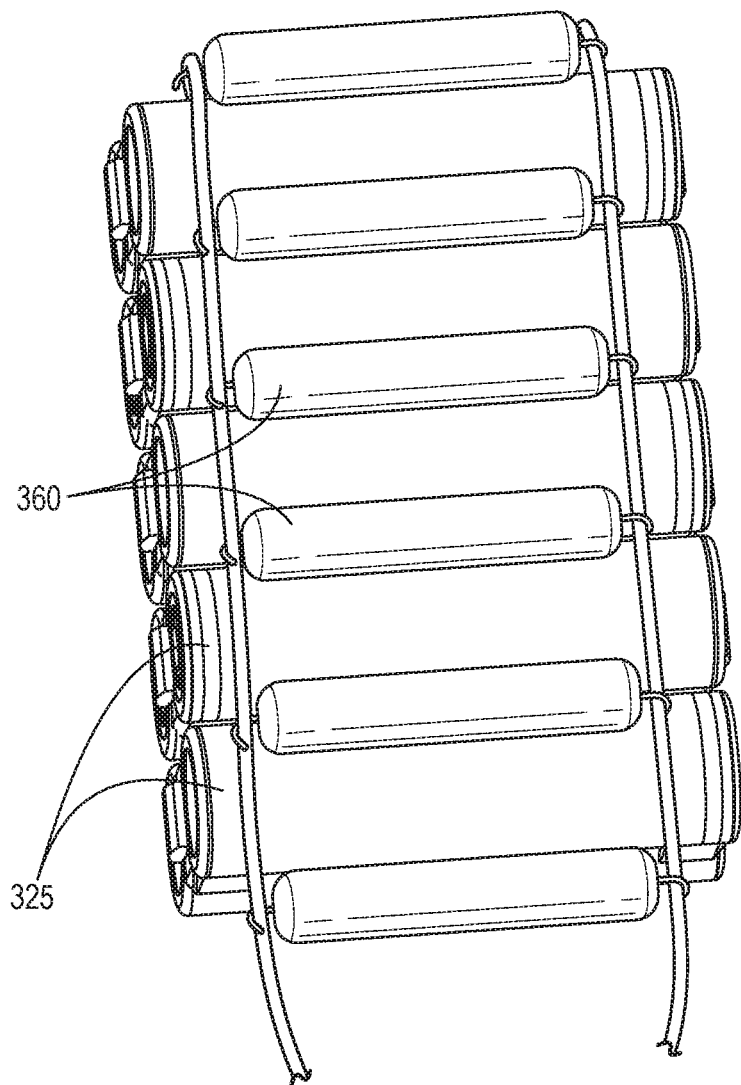
FIG. 3 is a perspective view of a row of battery cells that may be included in the battery packs of FIGS. 1A-1D and 2A-2D.

FIG. 3 illustrates a row of battery cells 325 that may be included in the battery pack 105 or 205. The battery cells 325 may correspond to the battery cells 125 or 225, described above. As shown in FIG. 3, one or more heating elements 360 may be placed between the battery cells 325 and on the outermost battery cells 325 and contact a side surface of the battery cells 325.

The heating elements 360 are generally located within the battery packs 105, 205 in an area away from the thermistors 150, 250 to ensure that the temperature measured by the thermistor 150, 250 corresponds to the temperature of the battery cells 125, 225, rather than of the heating elements 360. For example, in the battery pack 105 (see FIGS. 1A-1D), the heating elements 360 may be located underneath the battery cells 125 with the thermistor 150 located on top of the battery cells 125. As another example, in the battery pack 205 (see FIGS. 2A-2D), the heating elements 360 may be located between rows of battery cells 225 and/or underneath the bottom row of battery cells 225. In embodiments in which the thermistor 150, 250 is located in an alternate location, the heating elements 360 may be located in alternate location away from the thermistor 150, 240.

As shown in FIG. 3, the heating elements 360 may include resistors or other heat-generating electrical component. For example, as shown in FIG. 3, six (6) twenty ohm (20Ω) resistors are connected in parallel and operable to generate approximately thirty watts (30 W) of heating energy.

In other embodiments (not shown), the heating elements 360 include carbon fibers (e.g., high density (3 k, 6 k, 12 k, etc.) carbon fibers), resistive heating coils formed of carbon fibers, etc. The carbon fiber heating elements 360 may be directly laid under and/or between the battery cells 325. Such carbon fiber heating elements 360 are disclosed in U.S. Patent Application Publication No. U.S. 2011/0108538, published May 12, 2011, and in U.S. Patent Application Publication No. U.S. 2015/0271873, published Sep. 24, 2015, the entire contents of which are hereby incorporated by reference.

In other constructions (not shown), the carbon fiber may be formed in as a jacket for one or more battery cells 325. The carbon fiber may be formed as a rubber jacket (e.g., molded into or surrounded by rubber material). The carbon fiber jacket may hold the battery cell(s) 305 in place within the battery packs 105 and 205.

In some embodiments, heating elements 360 are embedded within the wedge elements 140 and/or 145 of the cases 130, 135 of the battery pack 105. Similarly, in some embodiments, heating elements 360 are embedded in the interior case 230 and/or the spacers 235 of the battery pack 205.

In alternate embodiments (not shown), the heating elements 360 may be located in a pad located underneath the battery cells 125, 225 or between rows of battery cells 225. Such a pad may be included in the battery pack 105, 205 for vibration reduction but may also include heating elements 360. For example, the pad may be made of carbon fiber material, as described above, that conducts electricity to generate heat. The pad of heating elements 360 may be molded or embedded into the housing 110, 210 of the battery pack 105, 205 (for example, in the interior of the bottom of the housing 110, 210).

The heating element(s) 360 may provide heat to a secondary material that distributes heat to the battery cells 325. For example, the battery packs 105, 205 may include (not shown) a container, reservoir or pouch of secondary material such as wax, mineral oil, water, or other material. The container of secondary material may be in contact with the heating element(s) 360 and with the outer surface of the battery cells 325. The heating element(s) 360 provide heat to the secondary material, and, in turn, the heated secondary material provides heat to the battery cells 325.

In further alternate embodiments (not shown), the heating elements 360 may be located inside individual jackets of each battery cell 325. In such embodiments, additional terminals may be provided on the battery cells 325 to provide power to the heating elements 360.

In other embodiments (not shown), the heating elements 360 may be positive temperature coefficient thermistors (PTCs), the resistance of which increases as the temperature increases. Accordingly, using PTCs as the heating elements 360 provides another method of limiting the current drawn by the heating elements 360. For example, when the PTCs draw too much current and heat up beyond their rated temperature, their resistance increases to essentially create an open circuit. In some embodiments, the rated temperature of the PTCs is approximately 75° F. to 80° F. Other PTCs (e.g., 100° F., 150° F., etc.) may be selected for the desired safety level, heating capacity/operation, etc.

Figure 4A:
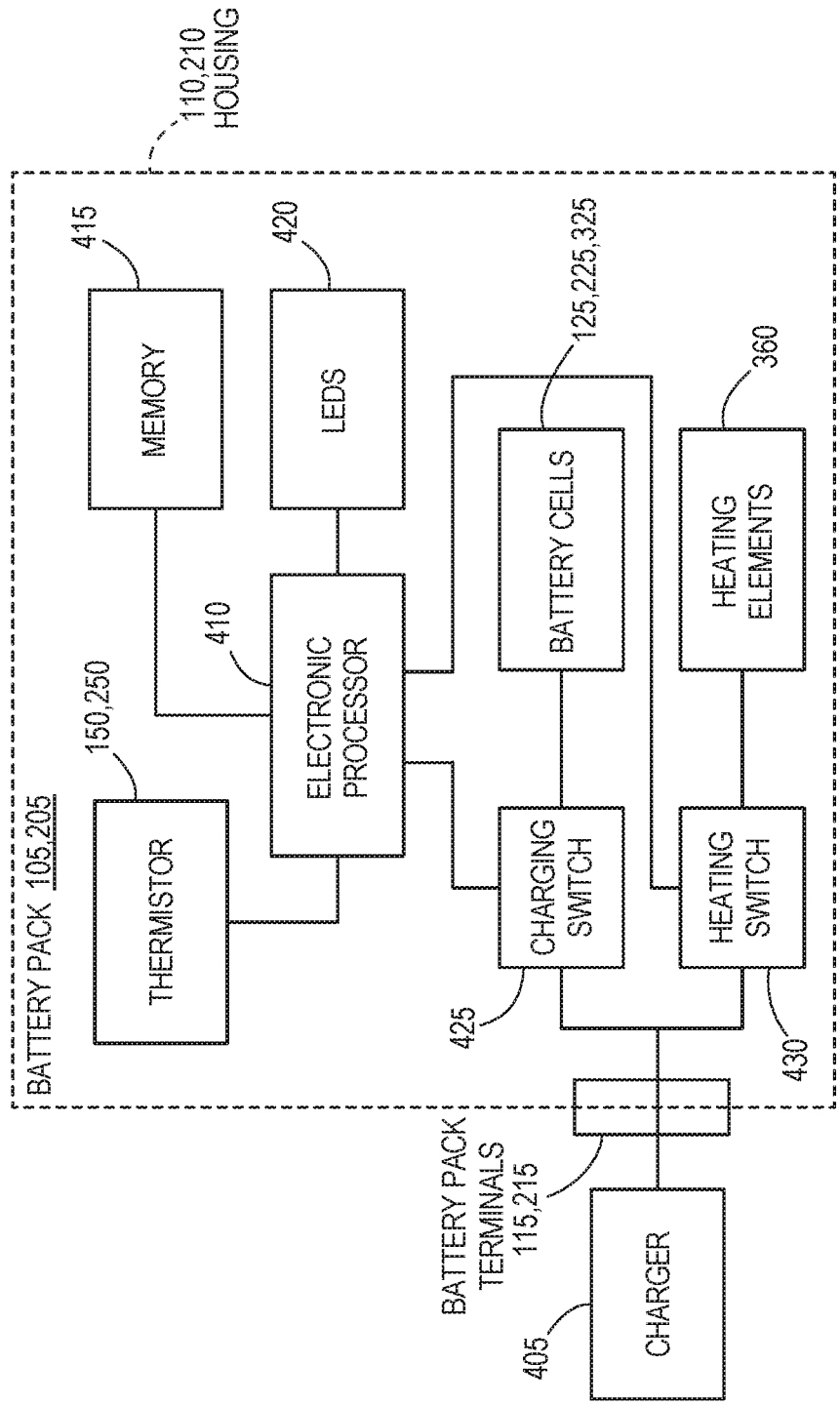
FIG. 4A is a block diagram of the battery packs of FIGS. 1A-1D and 2A-2D coupled to a charger.

FIG. 4A is a block diagram of the battery pack 105, 205 coupled to a charger 405. As shown in FIG. 4A, the battery pack 105, 205 includes an electronic processor 410 (for example, a microprocessor or other electronic controller), a memory 415, an indicator (for example, one or more light-emitting diodes (LEDs) 420), and the thermistor 150, 250.

The battery pack 105, 205 also includes a charging switch 425 (for example, a field-effect transistor (FET)) electrically coupled between the charger 405 and the battery cells 125, 225. The battery pack 105, 205 also includes a heating switch 430 (for example, a FET) electrically coupled between the charger 405 and the heating elements 360.

The memory 415 may include read only memory (ROM), random access memory (RAM), other non-transitory computer-readable media, or a combination thereof. The processor 410 is configured to receive instructions and data from the memory 415 and execute, among other things, the instructions. In particular, the processor 410 executes instructions stored in the memory 415 to control the states of the switches 425 and 430 (for example, based on the temperature of the battery cells 125, 225 as explained below).

The processor 410 is also configured to control the LEDs 420 (for example, to indicate a charging status of the battery pack 105, 205 or to indicate a condition of the battery pack 105, 205) and receive electrical signals relating to the temperature of the battery cells 125, 225 (for example, from the thermistor 150, 250).

Figure 4B:
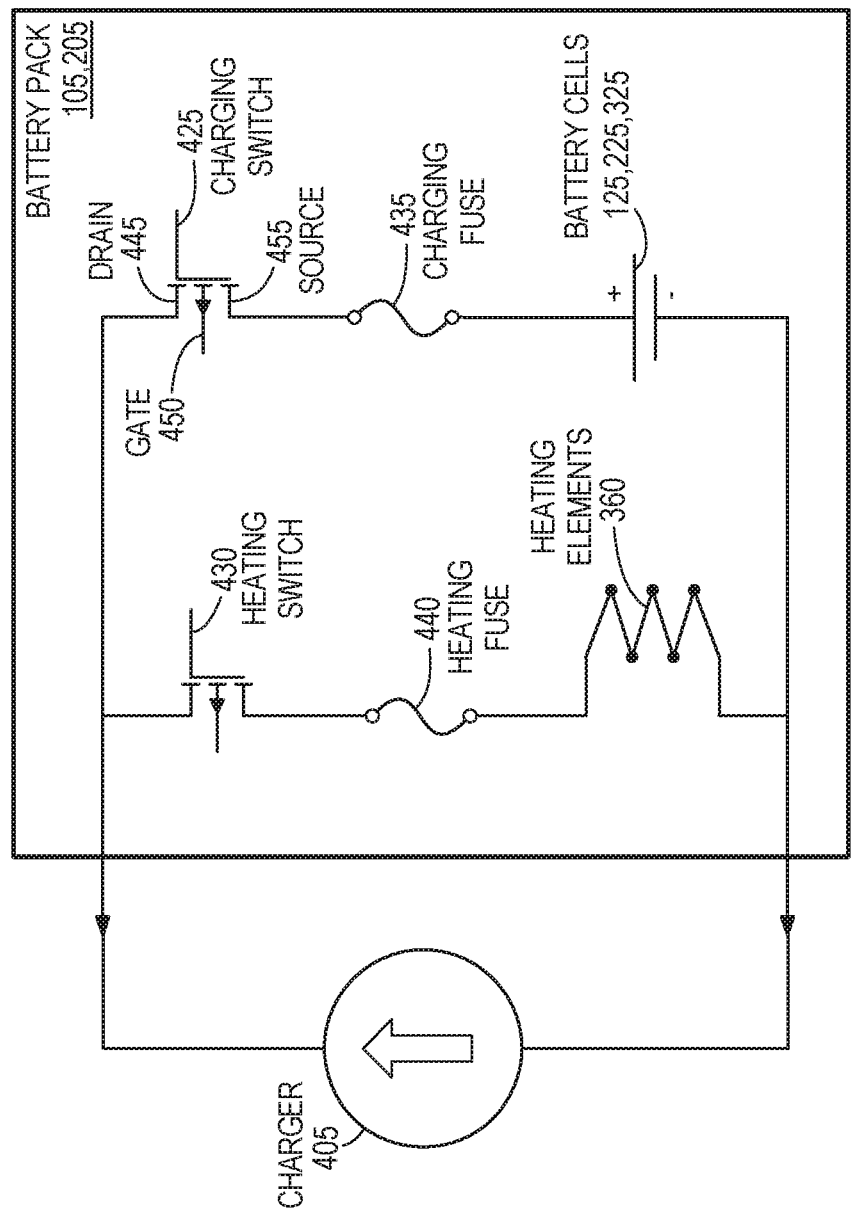
FIG. 4B is a circuit diagram of a portion of the battery packs of FIGS. 1A-1D and 2A-2D.

FIG. 4B is a circuit diagram of a portion of the battery pack 105, 205. As shown in FIG. 4B, the heating elements 360 and the battery cells 125, 225 are coupled in parallel with each other to the charger 405. The battery cells 125, 225 are coupled to the charger 405 through a series combination of the charging switch 425 and a charging fuse 435. The heating elements 360 are coupled to the charger 405 through a series combination of the heating switch 430 and a heating fuse 440. The switches 425, 430 are controlled by the processor 410 to allow or prevent current from the charger 405 to flow to the battery cells 125, 225 and the heating elements 360, respectively.

The fuses 435, 440 are used to prevent the battery cells 125, 225 and the heating elements 360, respectively, from drawing too much current from the charger 405. For example, if the charging switch 425 or the heating switch 430 fails such that the charging switch 425 or the heating switch 430 is in a permanently closed state (in other words, in a conducting state), the corresponding fuse 435, 440 may trip to prevent current flow to the battery cells 125, 225 and the heating elements 360, respectively.

For example, the heating elements 360 may draw approximately three amps (3.0 A) of current from the charger 405 during normal operation. However, if the heating switch 430 fails and cannot prevent current from flowing to the heating elements 360 as desired, the heating fuse 440 may be configured to trip (to prevent current from flowing to the heating elements 360) at approximately 4.0 to 4.5 A. Accordingly, in some embodiments, the heating fuse 440 may prevent the heating elements 360 from experiencing a current spike of 6 A.

In some embodiments (not shown), the battery pack 105, 205 includes a second charging switch (for example, another FET) in series with the charging switch 425. In such embodiments, the second charging switch allows the current drawn by the battery cells 125, 225 to be controlled when one of the charging switch 425 and the second charging switch fails such that it is in a permanently closed state. In some embodiments, the second charging switch is in series with the charging switch 425 between the charging switch 425 and the charging fuse 435. As shown in FIG. 4B, the charging switch 425 includes a drain 445, a gate 450, and a source 455. In some embodiments, the source 455 of the charging switch 425 is coupled to a source of the second charging switch and a drain of the second charging switch is coupled to the charging fuse 435 such that the second charging switch has an opposite orientation of the charging switch 425.

In some embodiments, the battery pack 105, 205 includes components (not shown) to detect if the heating switch 430 has failed (e.g., is in a permanently closed state). For example, a resistance network below the heating switch 430 may be used to detect whether the heating switch 430 is in a permanently closed state. As another example, components in the circuit may allow the voltage across the heating elements 360 to be measured directly.

Based on voltage measurements from the resistance network or the heating elements 360, the processor 410 may determine that the heating switch 430 has failed and is in a permanently closed state. When the processor 410 makes such a determination, the processor 410 may prevent the battery pack 105, 205 from being charged by, for example, opening the charging switch 425 to prevent current from flowing to the battery cells 125, 225. Alternatively or additionally, the processor 410 may provide an output that indicates that the heating switch 430 has failed (for example, by controlling the LEDs 420 to illuminate in a predetermined manner).

Figure 5:
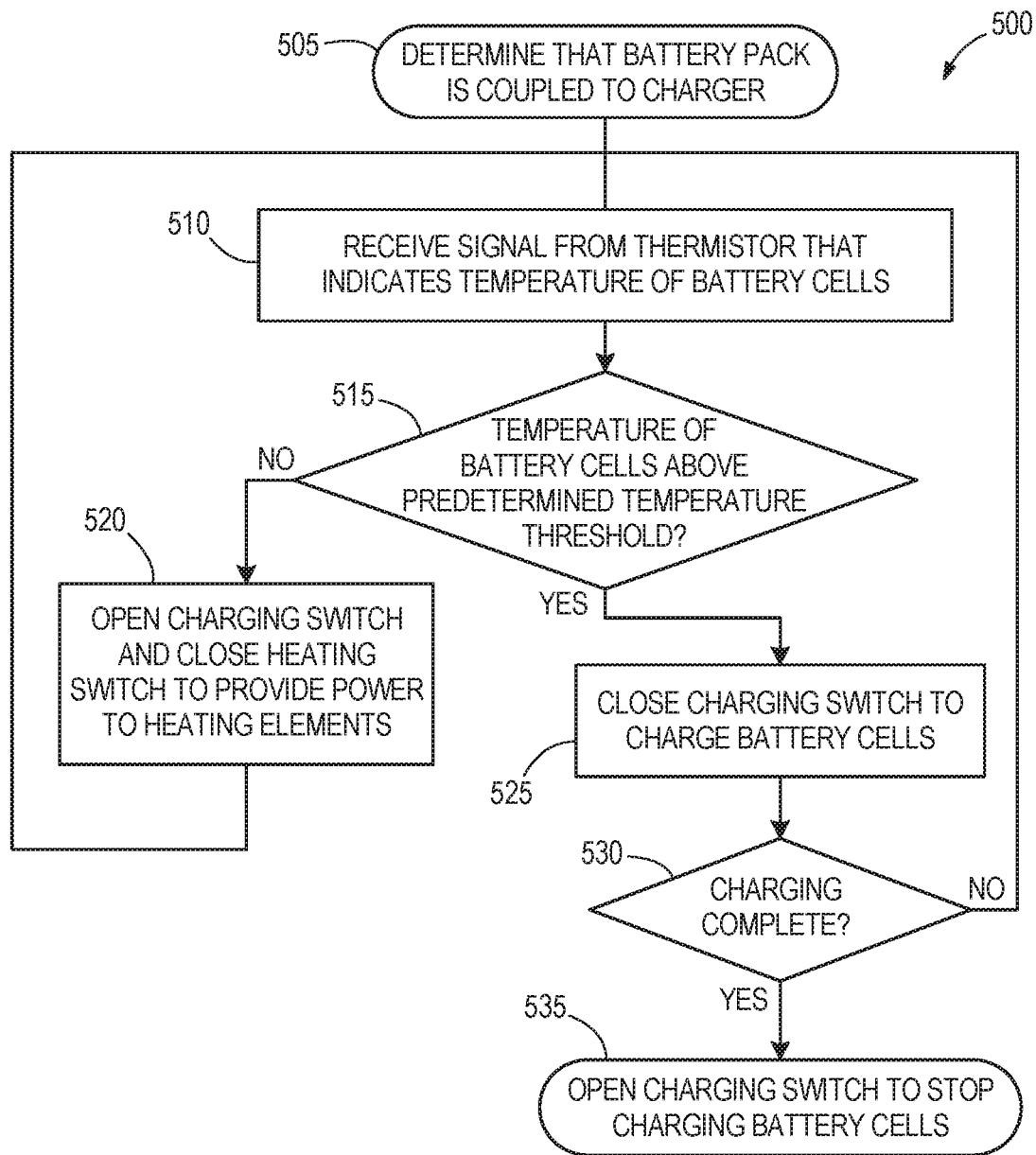
FIG. 5 is a flowchart of a method of charging the battery packs of FIGS. 1A-1D and 2A-2D performed by an electronic processor of the battery packs of FIGS. 1A-1D and 2A-2D.

FIG. 5 is a flowchart of a method 500 of charging the battery pack 105, 205 performed by the processor 410. By executing the method 500, the processor 410 controls the state of the switches 425, 430 when the battery pack 105, 205 is coupled to the charger 405 based on signals received from the thermistor 150, 250 that relate to the temperature of the battery cells 125, 225.

At block 505, the processor 410 determines that the battery pack 105, 205 is coupled to the charger 405. For example, the processor 410 may make such a determination by recognizing a change in voltage on the battery pack terminals 115, 215. At block 510, the processor 410 receives a signal from the thermistor 150, 250 that indicates a temperature of the battery cells 125, 225. In some embodiments, the processor 410 alternatively receives a signal from a thermistor that senses a temperature outside of the pack 105, 205 (e.g., an ambient air sensor as explained in greater detail below). In other embodiments, the processor receives a signal from a thermistor of another device (e.g., a thermistor of the charger 405 via a communication terminal of the battery pack terminals 115, 215). At block 515, the processor 410 determines whether the temperature of the battery cells 125, 225 is above predetermined temperature threshold (for example, 0° C.).

In some embodiments, the predetermined temperature threshold may vary depending on the chemistry of the battery cells 125, 225. In other words, battery cells of first chemistry may require that the temperature of the battery cells be above a different predetermined temperature threshold than battery cells of a second chemistry. If necessary, the processor 410 determines the predetermined temperature threshold for the chemistry of the battery cells 125, 225.

When the temperature of the battery cells 125, 225 is not above the predetermined temperature threshold, the processor 410 does not allow the battery cells 125, 225 to be charged. Accordingly, at block 520, the processor 410 opens the charging switch 425 (to prevent the battery cells 125, 225 from receiving power from the charger 405).

At block 520, the processor 410 also closes the heating switch 430 to provide power to the heating elements 360. The method 500 proceeds back to block 510 to monitor the temperature of the battery cells 125, 225 and, at block 515, determines whether the temperature of the battery cells 125, 225 has increased above the predetermined temperature threshold.

When the temperature of the battery cells 125, 225 is above the predetermined temperature threshold, at block 525, the processor 410 closes the charging switch 425 to provide power to the battery cells 125, 225 to charge the battery cells 125, 225. In some embodiments, at block 525, the processor 410 opens the heating switch 430 to stop providing power to the heating elements 360.

In other embodiments, the processor 410 may control the heating switch 430 to maintain its closed state to continue to provide power to the heating elements 360 (for example, to help ensure that the temperature of the battery cells 125, 225 remains above the predetermined temperature threshold (e.g., above 0° C.)). In yet other embodiments, the processor 410 may control the heating switch 430 using a pulse width modulation (PWM) signal to periodically provide power to the heating elements 360 during charging of the battery cells 125, 225 to help ensure that the temperature of the battery cells 125, 225 remains above the predetermined temperature threshold.

In such embodiments, the processor 410 may maintain the heating switch 430 in the closed state and/or provide the PWM signal to the heating switch 430 based on an ambient air temperature received from an ambient air sensor (for example, another thermistor) that determines the temperature outside the battery pack 105, 205. For example, when the ambient air temperature is below the predetermined temperature threshold or is below a second predetermined temperature threshold (for example, a temperature lower than the predetermined temperature threshold), the processor 410 may maintain the closed state of the heating switch 430 or control the heating switch 430 using a PWM signal.

In some embodiments, the duty cycle of the PWM signal is based on the ambient air temperature sensed by the ambient air sensor.

At block 530, the processor 410 determines whether charging of the battery cells 125, 225 is complete. For example, the processor 410 may monitor a voltage of the battery cells 125, 225 to make such a determination. As another example, the charger 405 may monitor the voltage of the battery cells 125, 225 and may send a signal to the processor 410 (for example, through communication terminals of the battery pack terminals 115, 215) to indicate to the processor 410 that charging is complete.

When charging is not complete, the method 500 proceeds back to block 510 to monitor the temperature of the battery cells 125, 225. Accordingly, the processor 410 repeats blocks 510, 515, 525, and 530 as long as the temperature of the battery cells 125, 225 is above the predetermined temperature threshold and charging of the battery cells 125, 225 is not yet complete. When charging of the battery cells 125, 225 is complete, at block 535, the processor 410 opens the charging switch 425 to stop charging the battery cells 125, 225. After the battery cells 125, 225 have been charged, the processor 410 may open the heating switch 430 to prevent the heating elements 360 from receiving power from the charger 405.

In other embodiments, the processor 410 may control the heating switch 430 to maintain the heating elements 360 in a state of low power maintenance heating so that the battery pack 105, 205 may be more easily charged again later. For example, the processor 410 may control the heating switch 430 using a PWM signal based on an ambient air sensor, as described above. In such embodiments, the heating elements 360 may receive power from the battery cells 125, 225 when the battery pack 105, 205 is removed from the charger 405. While providing power to the heating elements 360 from the battery cells 125, 225 may deplete the battery cells 125, 225 more quickly, it may also allow the temperature of the battery cells 125, 225 to be maintained above the predetermined temperature threshold. Accordingly, in some embodiments, the battery cells 125, 225 may charge more quickly when coupled to the charger 405 than if the heating elements 360 were not controlled to provide low power maintenance heating to the battery cells 125, 225.

As described above, in some embodiments, the heating elements 360 increase the temperature of the battery cells 125, 225 from below the predetermined temperature threshold to meet or exceed the predetermined temperature threshold in time period (e.g., approximately six minutes). When the battery cells 125, 225 are above the predetermined temperature threshold, full charging current can be drawn by the battery pack 105, 205 in environments in which the ambient temperature is below the predetermined temperature threshold after the battery pack 105, 205 has been coupled to the charger 405 for the time period (again, after about six minutes).

Figure 7:
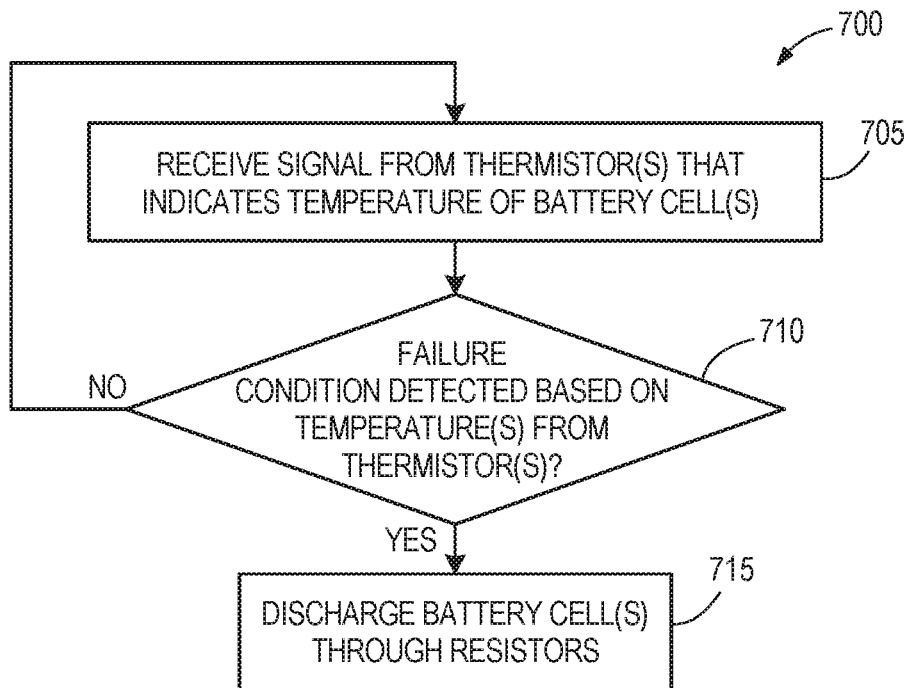
FIG. 7 is a flowchart of a method of monitoring for a failure condition of the battery pack of FIGS. 6A-6D and discharging one or more battery cells of the battery pack when a failure condition is detected.

It should be understood that each block diagram is simplified and in accordance with an illustrated embodiment. The block diagrams illustrate examples of the components and connections, and fewer or additional components/connections may be provided. For example, in some embodiments, the battery pack 105, 205, and 605 also includes an ambient air sensor (for example, another thermistor) that monitors the temperature outside the housing 110, 210 of the battery pack 105, 205. As another example, as described above with respect to FIG. 4B, the battery pack 105, 205 may include additional circuitry (for example, a resistance network) to detect a failure of the heating switch 430 (e.g.

that the switch 430 is in a permanently closed state). Similarly, the flowcharts in FIGS. 5 and 7 are simplified and illustrates an example, and fewer or additional steps may be provided.

FIGS. 6A-6D illustrate another construction of a battery pack 605 that may be used to provide power to electrical equipment or devices. The battery pack 605 is similar to the battery packs 105 and 205 described above, and common elements have the same reference number in the "600" series.

The following description will focus on aspects of the battery pack 605 different than the battery packs 105 and 205. It should be noted, however, that features of battery pack 605 may be incorporated or substituted into the battery pack 105, 205, or vice versa.

Figure 6A:
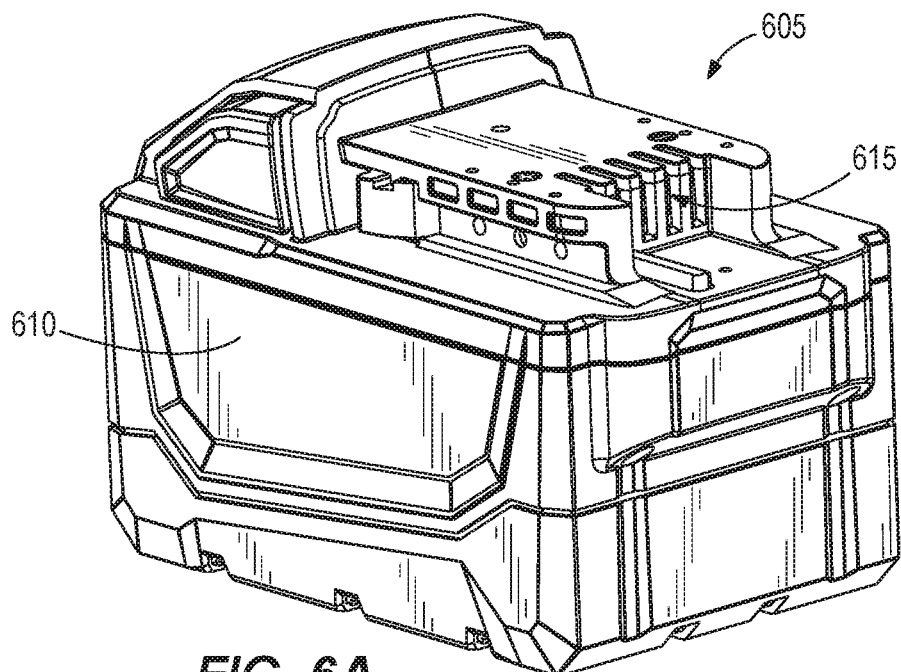
FIGS. 6A-6D are perspective views of another battery pack that may be used in cold environments and/or that may be used to discharge battery cells when a failure condition of the battery pack is detected.
Figure 6B:
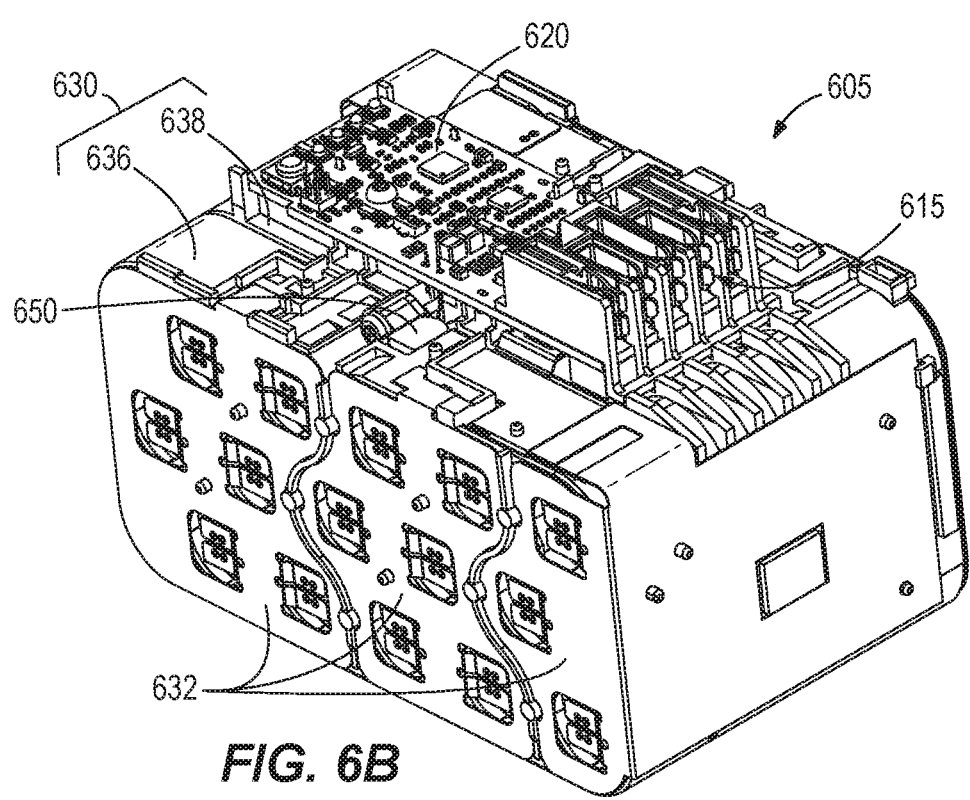
Figure 6C:
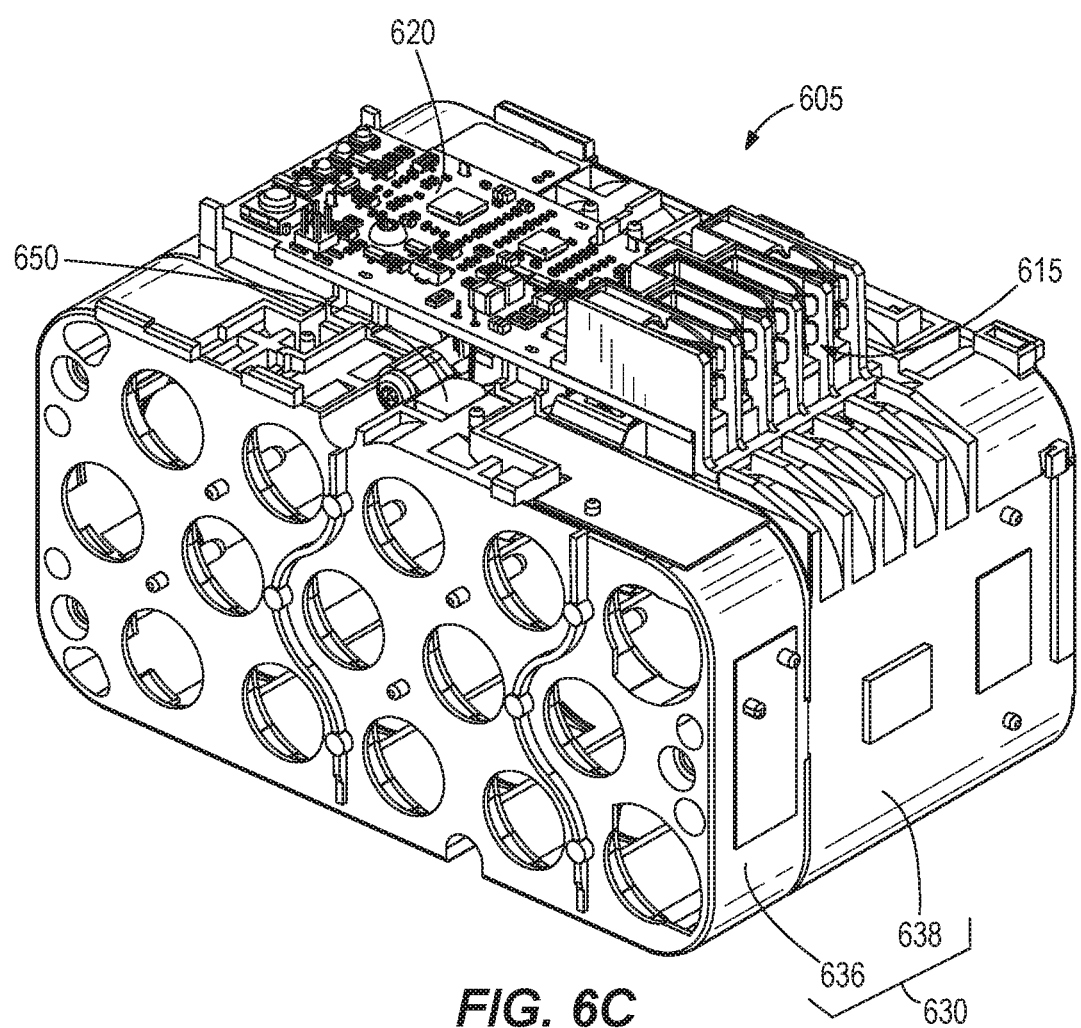

As shown in FIGS. 6A-6D, the battery pack 605 includes three rows of five battery cells. While the battery cells are not shown in FIGS. 6A-6D, the location of the battery cells is apparent based on the holes in an interior case 630 as shown in FIG. 6C. In other constructions, the battery pack 605 may include (see, e.g., FIGS. 1A-1D) one row of battery cells, two rows of battery cells (see, e.g., FIGS. 2A-2D), or more than three rows of battery cells (not shown) and/or the row(s) may include fewer or more than five battery cells (not shown).

The battery cells are held in place by the case 630 surrounding side surfaces of the outer battery cells but leaving ends of the battery cells exposed to allow them to be electrically coupled in a circuit (for example, by connectors 632 shown in FIG. 6B). The illustrated case 630 includes a left case portion 636 and a right case portion 638. In some embodiments, spacers (not shown) are provided between each pair of battery cells to further hold the battery cells in place (see, e.g., spacers 237 of FIGS. 2C and 2D).

The battery pack 605 includes one or more temperature sensing devices such as thermistors 650 electrically coupled to the PCB 620. As shown in FIGS. 6B-6C, the thermistor 650 is mounted on top of the case 630 and monitors the temperature of the interior of the battery pack 605 (i.e., a temperature of the battery cell(s)) through a hole in the top of the case 630. In the illustrated construction, the thermistor(s) 650 are located near the PCB 620 so that less wiring is used to couple the thermistor(s) 650 to the PCB 620 compared to thermistors located further from the PCB 620.

Figure 6D:
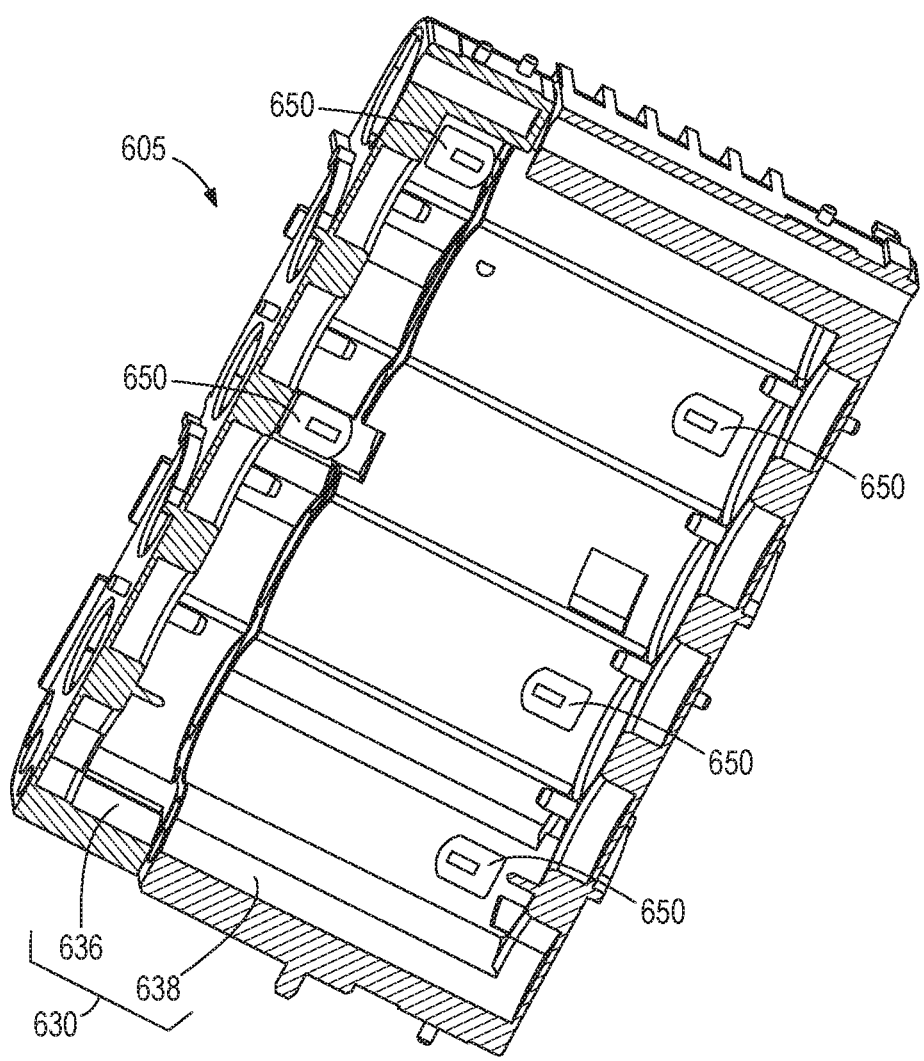

In some embodiments, the battery pack 605 includes additional thermistors 650 in other locations, as described previously. For example, FIG. 6D shows a cut-away view of the battery pack 605 from the bottom of the battery pack 605. In this example, the battery pack 605 includes five thermistors 650 mounted on the top of the case 630 and coupled to the PCB 620.

In some embodiments, each thermistor 650 may measure a temperature of a respective battery cell or string of battery cells. For example, each thermistor 650 of FIG. 6D may measure the temperature of the string of three battery cells located proximate the associated thermistor 650. In other constructions (not shown), the thermistors 650 may be positioned in other locations, such as between rows of battery cells, mounted on the bottom or sides of the case 630, etc. In other constructions (not shown), one or more of the thermistors 650 may be mounted on the weld/conductive strap connected to a battery cell.

As described above with respect to the battery packs 105 and 205, in some embodiments, the battery pack 605 includes resistors that, for example, may be used as heat-generating components 360 to heat the battery pack 605 in cold temperatures. Also as explained previously and as shown in FIG. 4B, the battery cells and these resistors (i.e., heating elements 360) are coupled in parallel with each other. Accordingly, these resistors may receive power from the battery cells to, for example, maintain the heating elements 360 in a state of low power maintenance heating.

These resistors may also be used for other purposes. In some embodiments, in addition or as an alternative to being used as heat-generating components 360, these resistors may be used to discharge one or more battery cells of the battery pack 605 to, for example, prevent failure of the battery pack 605 when an abnormal condition is detected (e.g., when abnormal temperatures are detected by one or more of the thermistors 650).

FIG. 7 is a flowchart of a method of monitoring for inhibiting failure of the battery pack 650 when a failure condition of the battery pack 605 is detected. In the illustrated method, failure may be inhibited by discharging one or more battery cells of the battery pack 605 when a failure condition is detected.

At block 705, the processor 410 receives a signal from one or more of the thermistors 650 indicating a temperature of one or more battery cells of the battery pack 605. Based on the signal(s) from the thermistor(s) 650, at block 710, the processor 410 determines whether the battery pack 605 is in a failure condition. When the battery pack is determined not to be in a failure condition (at block 710), the method 700 proceeds back to block 705 to continue to monitor the temperatures measured by the thermistors 650.

To determine a failure condition, the processor 410 may, for example, determine that the battery pack 605 is in a failure condition based on a temperature differential between temperature measurements from two different thermistors (e.g., one temperature measurement is ten degrees higher than one or more other temperature measurements). As another example, when any one of the thermistors 650 transmits a signal indicating that the temperature is above a predetermined temperature threshold, the processor 410 may determine that the battery pack is in a failure condition.

In response to determining that the battery pack 605 is in a failure condition, at block 715, the processor 410 may control the switches 425, 430 such that one or more battery cells are discharged through the resistors (i.e., the heating elements 360). In some embodiments, the processor 410 may discharge the entire battery pack 605 (i.e., all battery cells). In other embodiments, the processor 410 may discharge a subset of the battery cells (i.e., a string of battery cells whose temperature was determined to be higher than that of the other strings of battery cells).

In some embodiments, it may be undesirable to produce excessive heat when discharging the battery cells after a failure condition is determined, for example, in constructions in which the resistors are also used as heat-generating components 360, as the excessive heat will be transferred back to the cells experiencing a failure condition. Accordingly, the processor 410 may control the switches 425 and/or 430 to discharge that battery cells using a PWM signal. Using the PWM signal to discharge the battery cells causes less current to flow through the resistors per unit of time such that the heat generated by the resistors is less than when current is allowed to flow through the resistors at all times.

To reduce heat transfer to the battery cells during discharge through the resistors, in some embodiments, the battery pack 605 includes resistors that are not used as heating elements 360. In other words, the primary purpose of such resistors would be to allow for battery cell discharge when a failure condition is detected by the processor 410 rather than as heating elements as described previously. In such embodiments, the resistors may be thermally separated and isolated from the battery cells. For example, the resistors may be insulated from the cells (e.g., by mica tape), located outside of the case 630, thermally coupled to a heat sink exposed to an air flow path to be cooled, etc. In such embodiments, the processor 410 may optionally control the switches to discharge the battery cells using a PWM signal to further reduce possible heating.

In some embodiments, the processor 410 monitors the temperature from the thermistors 650 and discharges the battery cells through the resistors when the battery pack 605 is not coupled to a device, such as the charger 405 or a power tool. In other embodiments, the processor 410 may also execute the method when the battery pack 605 is connected to a device.

Figure 8:
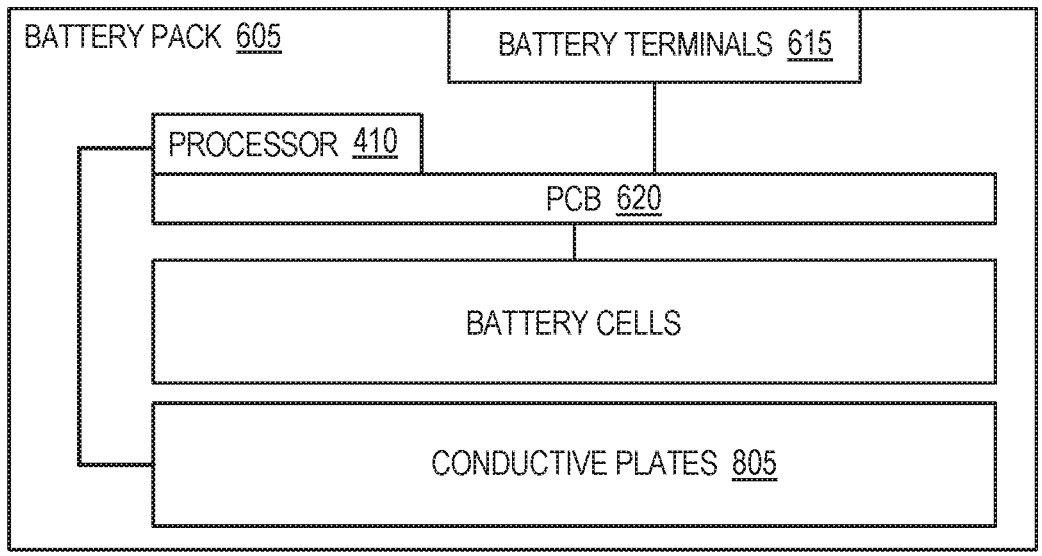
FIG. 8 is a block diagram of the battery pack of FIGS. 6A-6D according to one embodiment.

In some embodiments, the battery pack 605 may detect a failure condition in other manners besides monitoring temperature(s) measured by thermistors 650. FIG. 8 is a block diagram of the battery pack 605 according to one such embodiment. As shown in FIG. 8, the battery pack 605 includes conductive plates 805 to determine whether fluid has entered the battery pack housing 610 and to measure the conductivity of such fluid (i.e., ingress fluid; conductivity being equal to Siemens per meter with Siemens being current divided by voltage).

Figure 9:
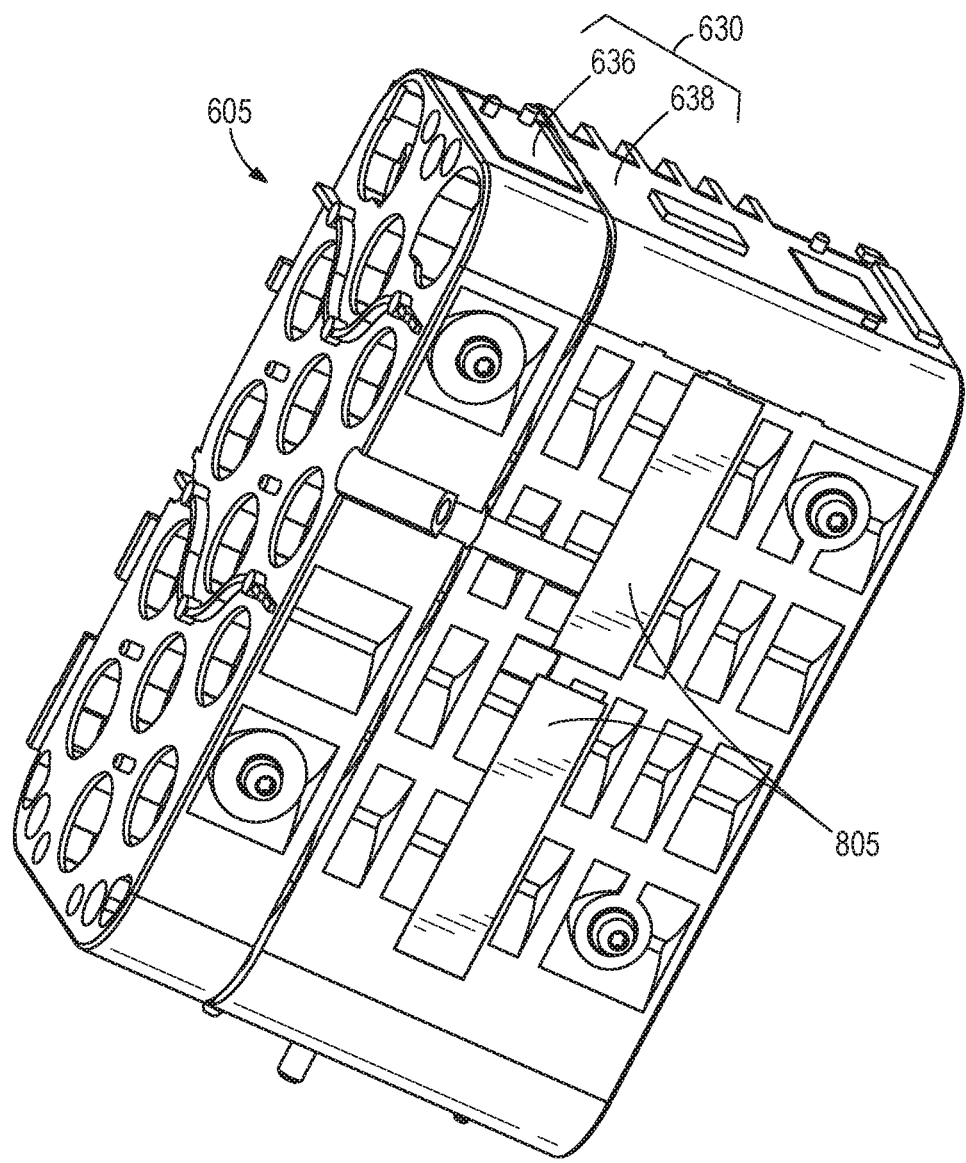
FIG. 9 is a perspective view of the battery pack of FIGS. 6A-6D from the bottom of the battery pack with the housing removed according to one embodiment.

FIG. 9 is a bottom perspective view of the battery pack 605 with the housing 610 removed. As shown in FIG. 9, the battery pack 605 includes a number of (e.g., two) conductive plates 805 located underneath the battery cells.

The conductive plates 805 may, for example, be mounted on a single PCB, separate PCBs, stand-offs, or directly on the bottom of the interior case 630. Locating the conductive plates 805 proximate or on the bottom of the interior case 630 allows for detection of ingress fluid when the battery pack 605 is placed in an area that has standing fluid, for example. As another example, such conductive plates 805 may detect ingress fluid if enough ingress fluid has entered the housing 610 to create a pool of fluid at the bottom of the battery pack 605.

In some embodiments, the conductive plates 805 are located elsewhere in the battery pack 605 (e.g., on the sides or top of the interior case 630). In some embodiments, the battery pack 605 includes additional conductive plates 805 in other locations (i.e., multiple sets of conductive plates 805). In some embodiments, the conductive plates 805 are located within, for example, one millimeter, two millimeters, or three millimeters of each other such that the conductivity of a small amount of ingress fluid can be detected and measured. The closer together conductive plates 805 are located, the less fluid is required to measure conductivity.

In some embodiments, the conductive plates 805 are located in a stacked arrangement such that, when ingress fluid is present in the battery pack 605, current flows between the largest surfaces of the conductive plates 805 when a voltage is applied to the conductive plates as described in greater detail below.

Figure 10A:
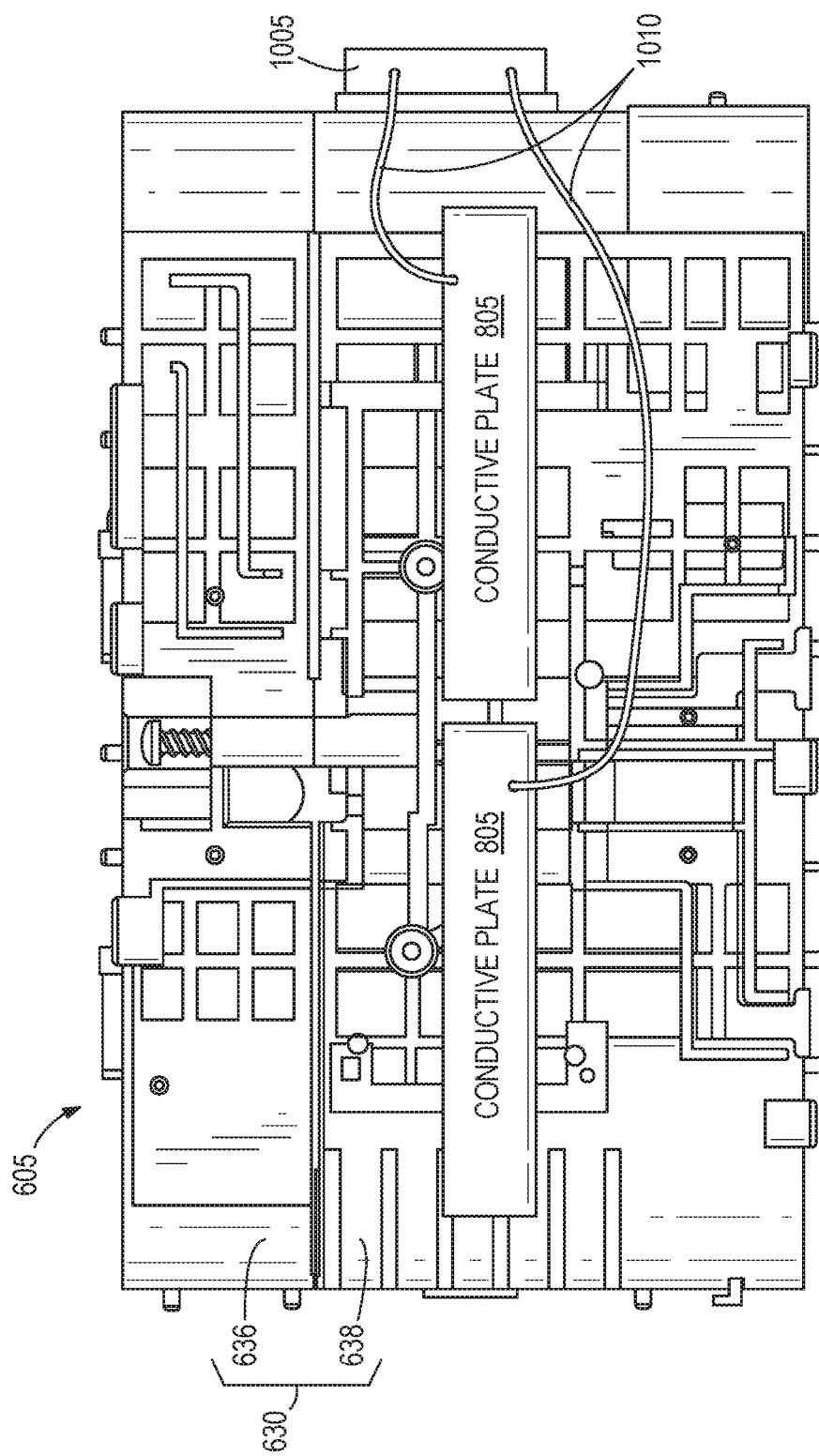
FIGS. 10A and 10B are bottom views of the battery pack of FIGS. 6A-6D according to various embodiments.

FIG. 10A is a bottom view of the battery pack 605 according to one embodiment. As shown in FIG. 10A, the conductive plates 805 are coupled to a PCB 1005 via wires 1010. The PCB 1005 may be coupled to the PCB 620 via additional wires (not shown) to allow the processor 410 to measure the conductivity of ingress fluid using the conductive plates 805 as explained in greater detail below. In some embodiments, the wires 1010 may connect the conductive plates 805 directly to the PCB 620 (i.e., the PCB 1005 may not be present in some embodiments).

Figure 10B:
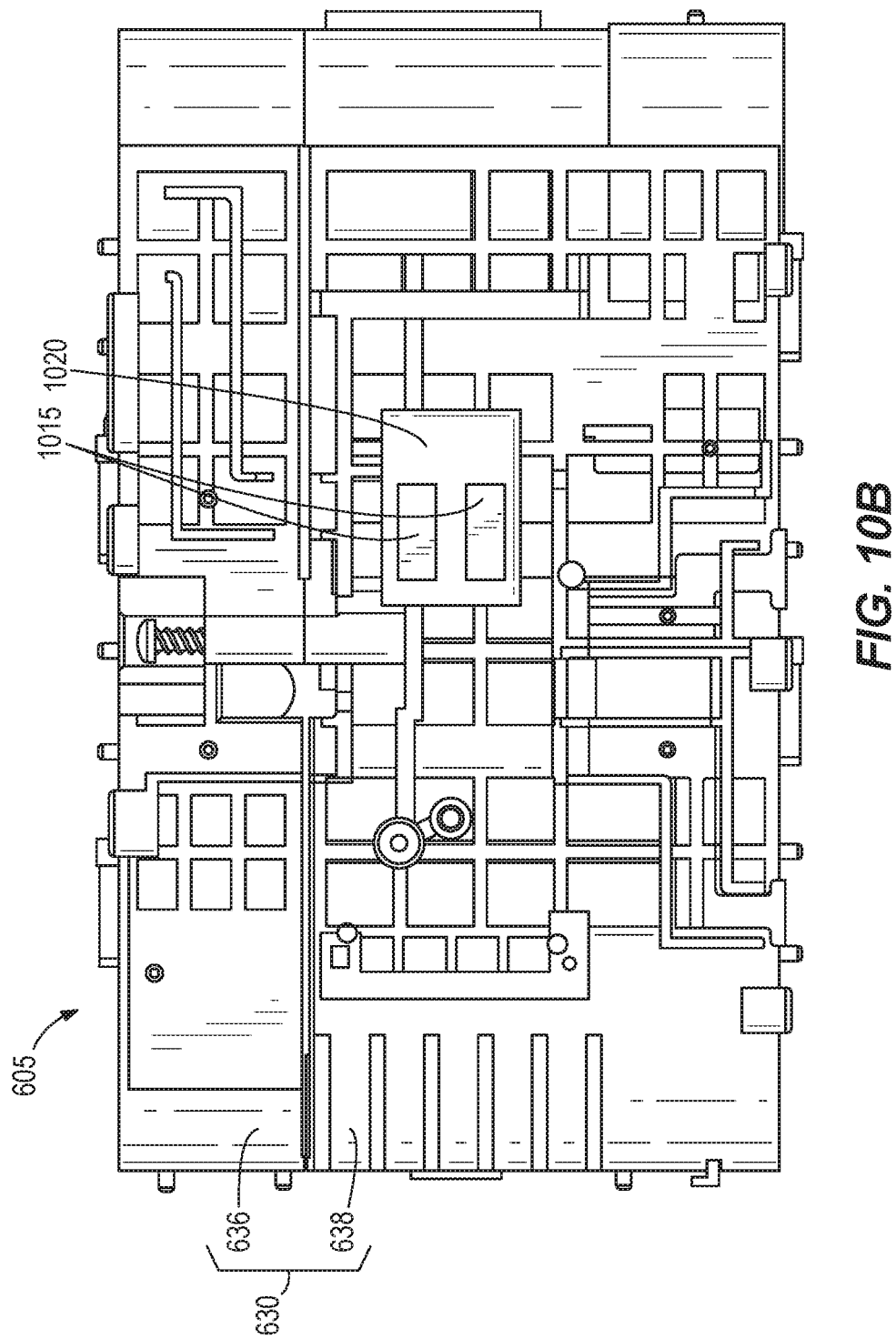

FIG. 10B is a bottom view of the battery pack 605 according to another example embodiment. As shown in FIG. 10B, conductive plates 1015 are smaller than the conductive plates 805 of FIG. 10A but perform a similar function. In some embodiments, the conductive plates 1015 are mounted on a PCB 1020 that is coupled to the PCB 620 via wires (not shown) to allow the processor 410 to measure the conductivity of ingress fluid using the conductive plates 1015. In some embodiments, an off-the-shelf conductivity sensor is used alternatively or in addition to the conductive plates 805 and 1015. For example, the conductivity sensor may be a contacting conductivity sensor or an inductive conductivity sensor (e.g., toroidal or electrodeless).

Figure 11A:
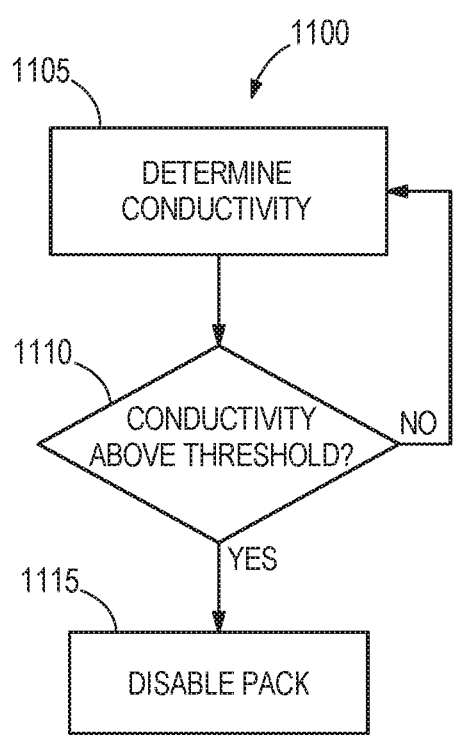
FIGS. 11A and 11B are flowcharts of methods of measuring the conductivity of ingress fluid in the battery pack of FIGS. 6A-6D according to one embodiment.
Figure 11B:
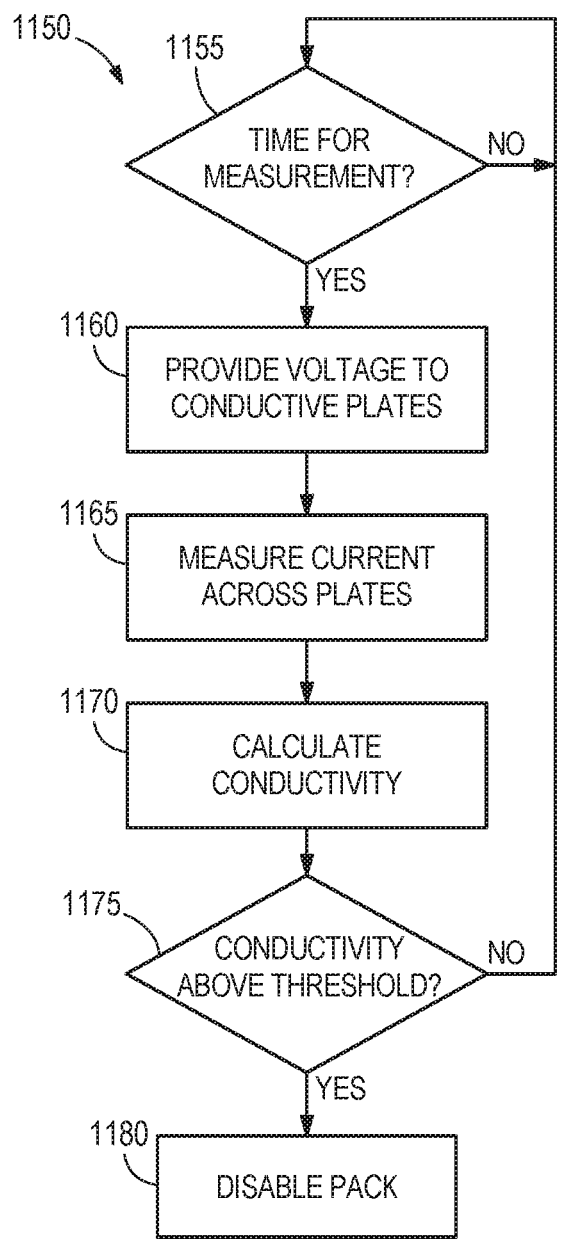

FIGS. 11A and 11B illustrate methods 1100 and 1150 of measuring the conductivity of ingress fluid in the battery pack 605 according to one embodiment. With reference to FIG. 11A, at block 1105, the processor 410 determines the conductivity between the conductive plates 805, as explained in greater detail below with respect to FIG. 11B. At block 1110, the processor 410 determines whether the conductivity is above a predetermined conductivity threshold (e.g., approximately 4.5 Siemens per meter).

When the conductivity is less than the predetermined conductivity threshold, the method 1100 proceeds back to block 1105 such that the processor 410 continues to determine the conductivity between the conductive plates 805. At block 1110, when the conductivity is above the predetermined threshold, at block 1115, the processor 410 disables the battery pack 605 by, for example, discharging the battery cells through the heat-generating components 360 or other resistors, as explained previously with respect to block 715 of FIG. 7.

FIG. 11B illustrates the method 1150 that may be executed by the processor 410 in some embodiments to measure the conductivity of ingress fluid in the battery pack 605. When executing the method 1150, the processor 410 periodically measures the conductivity between the conductive plates 805 (e.g., every five seconds, one second, one hundred milliseconds, etc.).

At block 1155, the processor 410 determines whether it is time for a conductivity measurement (i.e., whether the preset periodic time has elapsed since the previous conductivity measurement). When it is not yet time for a conductivity measurement, the method 1150 remains at block 1155. When it is time for a conductivity measurement, at block 1160, the processor 410 provides a voltage to the conductive plates 805.

At block 1165, the processor 410 measures a current across the conductive plates 805. At block 1170, the processor 410 calculates the conductivity between the conductive plates 805 based on the voltage provided by the processor 410, the current measured by the processor 410, and the size of the conductive plates 805. For example, the processor 410 may calculate the conductivity of the ingress fluid by dividing the measured current by the provided voltage and by then dividing the result by the surface area of the conductive plates 805.

At block 1175, the processor 410 determines whether the calculated conductivity is above a predetermined threshold. In some embodiments, the predetermined threshold may be approximately or just below a conductivity of sea water, which is approximately 4.8 Siemens per meter, to ensure that the processor 410 disables the battery pack 605 when an ingress fluid with a conductivity greater than or equal to the conductivity of sea water is detected. For example, the predetermined threshold may be set to approximately 4.5 Siemens per meter.

At block 1175, when the calculated conductivity is less than the predetermined threshold, the processor 410 determines that no ingress fluid is present or that the ingress fluid has a conductivity that is not a risk to cause a failure condition of the battery pack 605. Accordingly, the method 1150 proceeds back to block 1155 to continue to measure the current and calculate the conductivity between the conductive plates 205 at periodic time periods.

At block 1175, when the calculated conductivity is greater than or equal to the predetermined threshold, at block 1180, the processor 410 disables the battery pack 605. For example, the processor 410 may discharge the battery cells through the heat-generating components 360 or other resistors as explained previously with respect to block 715 of FIG. 7.

In some embodiments, the processor 410 may discharge parallel strings of battery cells (e.g., five of the fifteen battery cells) separately to reduce the amount of current being discharged by the battery cells that may be conducted by the ingress fluid, as explained in greater detail below with respect to FIG. 12. For example, a single string of five battery cells (e.g., 18650 cells (having a diameter of 18 mm and a length of 65 mm), 20700 cells, and 21700 cells) or two strings of five battery cells (e.g., 18650 cells) may not provide enough current such that the current can be conducted through the ingress fluid. Accordingly, discharging a single string of five battery cells one at a time or two strings of battery cells instead of all battery cells may inhibit or prevent further failure of the battery pack 605.

Figure 12:
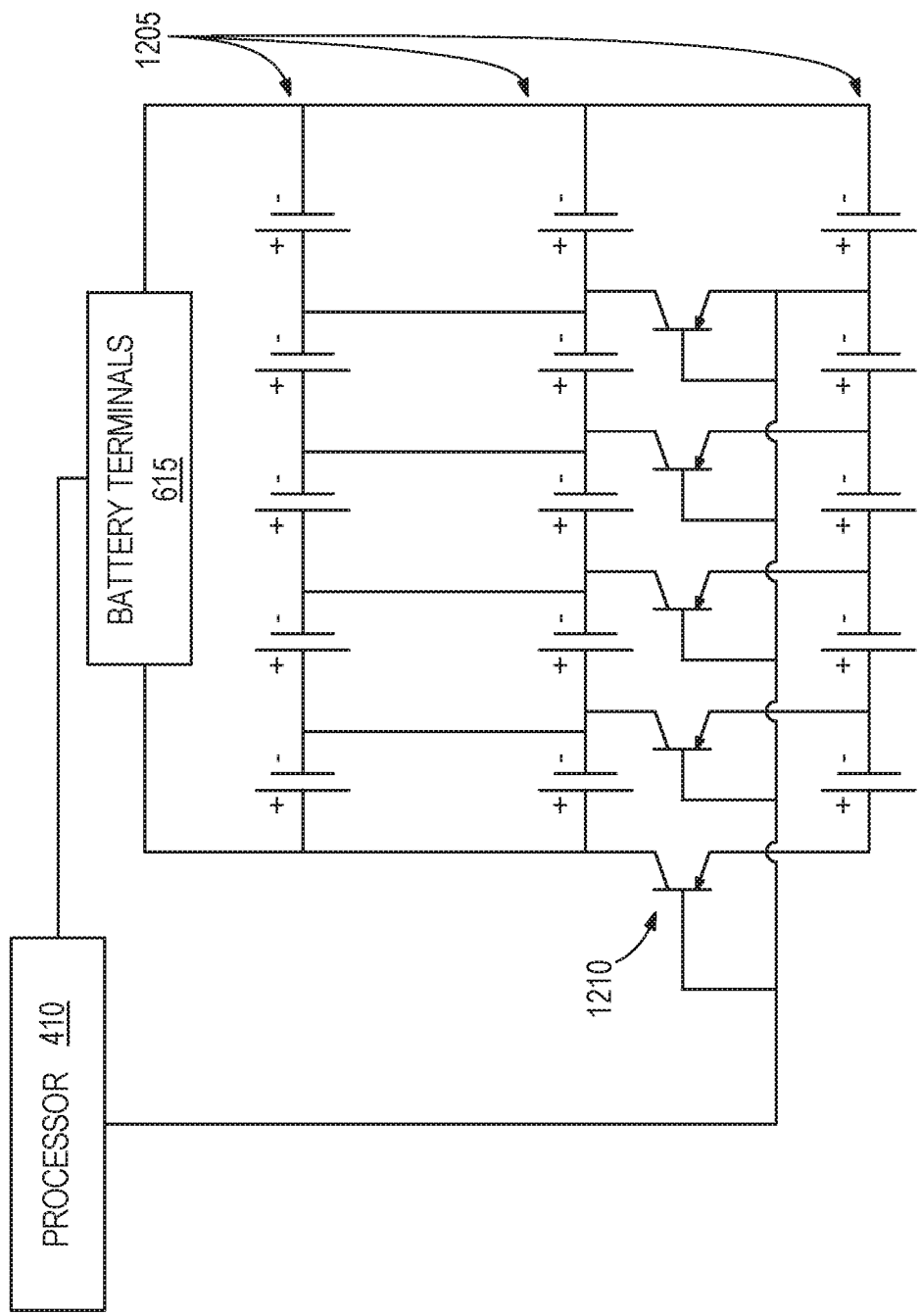
FIG. 12 is a circuit diagram of a portion of the battery pack of FIGS. 6A-6D according to one embodiment.

As shown in FIG. 12, the battery cells of the battery pack 605 are separated into three separate strings of battery cells 1205. In some embodiments, each string of battery cells 1205 has five battery cells in series, and the strings of battery cells 1205 are connected in parallel to the battery terminals 615. In some embodiments, the strings of battery cells 1205 are also connected in parallel to the heat-generating components 360 or other resistors, as explained previously with respect to block 715 of FIG. 7, to allow the battery cells to be discharged through the heat-generating components 360 or other resistors.

The battery pack 605 also includes FETs 1210. As shown in FIG. 12, the battery pack 605 includes a FET 1210 between each battery cell of the second and third strings of battery cells 1205. In some embodiments, the processor 410 may control the FETs 1210 to separate the strings of battery cells 1205. For example, when a failure condition of the battery pack 605 is detected, the processor 410 opens the FETs 1210 to prevent current flow through the FETs 1210. Accordingly, the third string of battery cells 1205 (i.e., the bottom string of battery cells 1205 in FIG. 12) is isolated and the battery pack 605 is effectively a battery pack with two parallel strings of five battery cells. In some embodiments, the processor 410 discharges the two parallel strings of battery cells 1205 (i.e., the top two strings of battery cells 1205 in FIG. 12). In some embodiments, the single isolated string of battery cells 1205 (i.e., the bottom string of battery cells 1205 in FIG. 12) is self-discharged. In other words, the stored charge of the isolated string of battery cells 1205 may be reduced without a connection between the electrodes of the battery cells to, for example, the heat-generating components 360 or other resistors.

In some embodiments, two parallel strings of battery cells (e.g., 18650 battery cells) may not provide enough current to be conducted through ingress fluid in the battery pack 605. In some embodiments, the processor 410 prevents the FETs 1210 from being closed once a failure condition is detected and the FETs 1210 are opened. Although FIG. 12 shows the FETs 1210 located between the second and third strings of battery cells 1205, in other embodiments, the FETs 1210 are located between the first and second strings of battery cells 1205. In such embodiments, when the processor 410 opens the FETs 1210 in response to a failure condition being detected, the second and third strings of battery cells 1205 (i.e., the bottom two strings of battery cells 1205 in FIG. 12) are isolated, and the battery pack 605 is effectively a battery pack with one parallel string of five battery cells.

Figure 13:
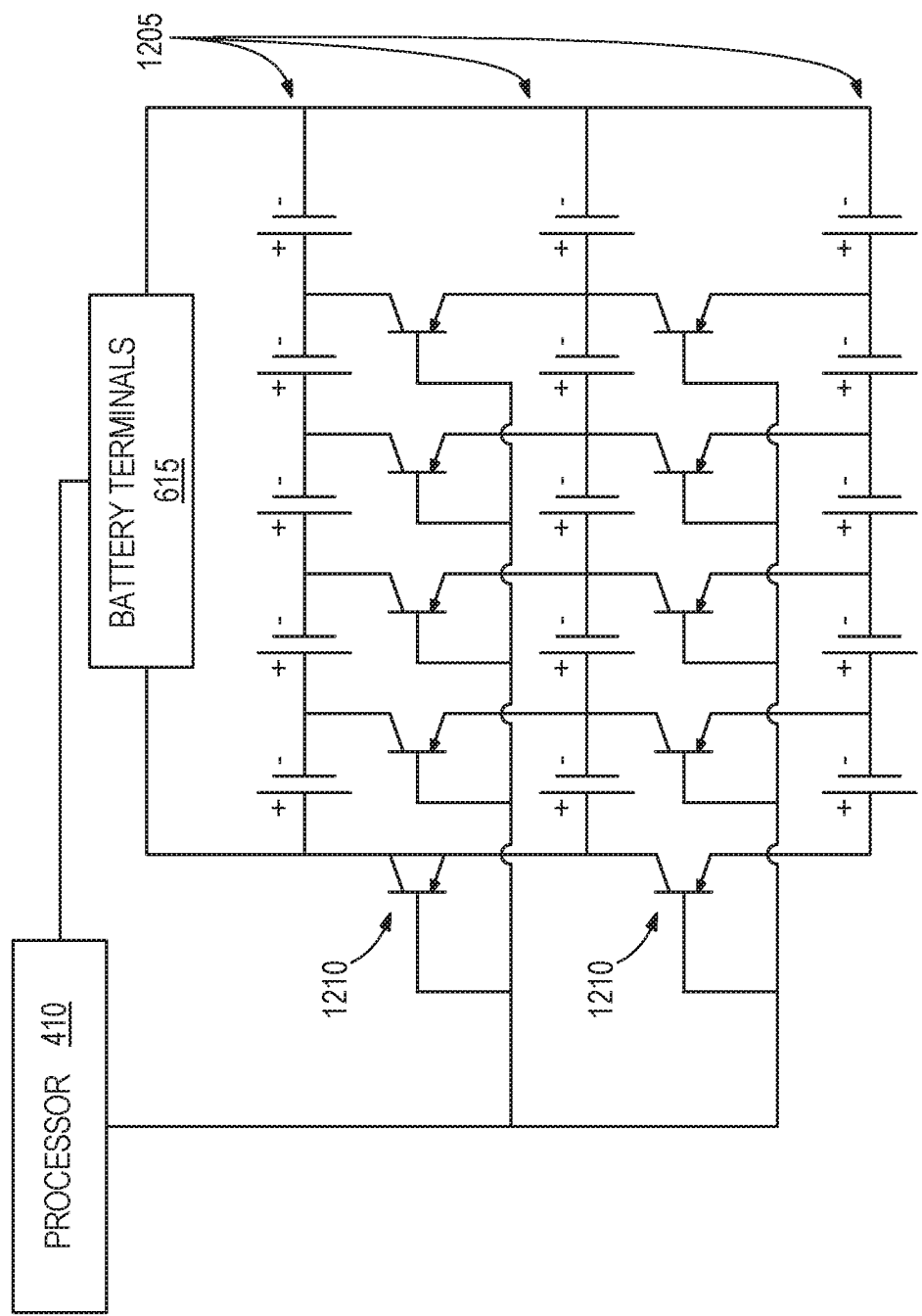
FIG. 13 is a circuit diagram of a portion of the battery pack of FIGS. 6A-6D according to another embodiment.

Similar to FIG. 12, FIG. 13 is a circuit diagram of a portion of the battery pack 605 according to another embodiment. As shown in FIG. 13, the battery pack 605 includes FETs 1210 between the first and second strings of battery cells 1205 and between the second and third strings of battery cells 1205. Accordingly, upon detection of a failure condition, the processor 410 can open the FETs 1210 to individually isolate each string of battery cells 1205. In some embodiments, each isolated string of battery cells 1205 may be self-discharged.

Figure 14:
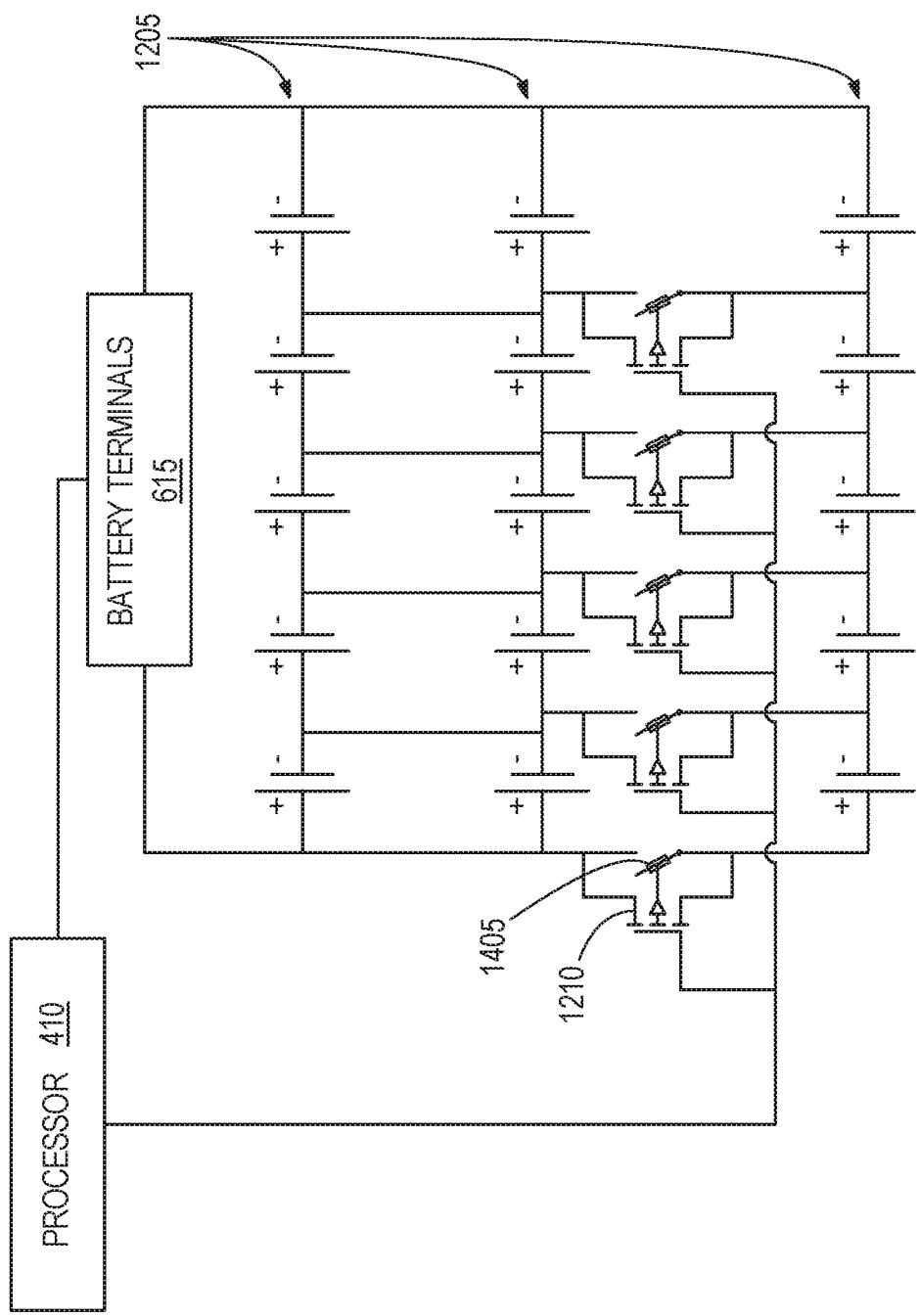
FIG. 14 is a circuit diagram of a portion of the battery pack of FIGS. 6A-6D according to yet another embodiment.

Similar to FIGS. 12 and 13, FIG. 14 is a circuit diagram of a portion of the battery pack 605 according to yet another embodiment. The battery pack 605 includes switches 1405 between the strings of battery cells 1205 that can be used to separate or isolate the strings of battery cells 1205. For example, the switches 1405 may be electromechanical switches actuated by the FETs 1210 controlled by the processor 410. In some embodiments, when a failure condition of the battery pack 605 is detected, the processor 410 controls the FETs 1210 to open the switches 1405 to prevent current flow through the switches 1405. Accordingly, the third string of battery cells 1205 (i.e., the bottom string of battery cells 1205 in FIG. 12) is isolated and the battery pack 605 is effectively a battery pack with two parallel strings of five battery cells. In some embodiments, the processor 410 discharges the two parallel strings of battery cells 1205 (i.e., the top two strings of battery cells 1205 in FIG. 12), as explained above with respect to FIG. 12. In any of these embodiments, each isolated string of battery cells 1205 that is isolated from the heat-generating components 360 or resistors may be self-discharged.

In some embodiments, fuses may be used in place of the FETs 1210 and/or the switches 1405. In such embodiments, after a failure condition is detected, all strings of battery cells 1205 may begin discharging at the same time (for example, through the heat-generating components 360 or other resistors) until the current through the fuses exceeds a predetermined limit and causes one or more of the fuses to blow and prevent current flow. When this occurs, a reduced number of strings of battery cells (e.g., one or two strings of battery cells 1205) will continue to discharge. In embodiments that use fuses, the processor 410 may not need to prevent the FETs 1210 from later allowing current to flow after a failure condition has been detected (as mentioned previously) because once the fuses blow, they will prevent current from flowing until the fuses are replaced.

Although FIG. 14 shows the switches 1405 and the FETs 1210 between each battery cell of the second and third strings of battery cells 1205, in some embodiments, the battery pack 605 may additionally or alternatively include switches 1405, FETs 1210, and/or fuses located between the first and second strings of battery cells 1205 similar to previous embodiments described herein.

Once the battery pack 605 has been disabled, the battery pack 605 may remain non-functional. However, in some embodiments, after the battery pack 605 is disabled or discharged and the failure condition is no longer detected, the processor 410 may control the FETs 1210 to allow the battery pack 605 to function normally (e.g., provide current from all strings of battery cells 1205). In some embodiments, after the battery pack 605 is disabled and one or more strings of battery cells have been isolated, the processor 410 controls the FETs 1210 to allow the battery pack 605 to function normally in response to detection of an external resistor bank attachment being coupled to the battery pack 605 as described in greater detail below.

Although disabling the battery pack 605 and discharging the battery cells through resistors in response to detecting a failure condition has been described with respect to the battery pack 605, the battery packs 105, 205 may include such features and functionality in some embodiments. For example, the battery pack 205 may include two parallel strings of battery cells (e.g., 20700 cells or 21700 cells). In some embodiments, FETs, other switches, fuses, or a combination thereof may be located between each battery cell of the two parallel strings of battery cells to allow a processor of the battery pack 205 to isolate the strings of battery cells when a failure condition is detected. Once the strings of battery cells are isolated, the processor may control one or two strings of battery cells to discharge through the heat-generating components 360 or other resistors as explained previously. In any of the above embodiments, each isolated string of battery cells 1205 that is isolated from the heat-generating components 360 or resistors (e.g., the bottom string of battery cells 1205 of FIG. 12) may be self-discharged.

Accordingly, when a failure condition (e.g., based on temperature, ingress fluid detection, etc.) of a battery cell, a string of battery cells, or a battery pack is detected, the battery pack can be partially or completely discharged or disabled using various methods as described herein.

In some embodiments, the battery packs 105, 205, and 605 may include an indicator that conveys information to a user. For example, the indicator may be a light-emitting diode (LED), a speaker, etc. In some embodiments, the indicator may indicate that the processor has detected a failure condition of the battery pack (e.g., based on temperature, ingress fluid detection, etc.). In some embodiments, the battery pack may include a wireless communication transceiver that transmits a signal to an external device (e.g., smart phone) that indicates that the processor has detected a failure condition of the battery pack.

Although the previously-described embodiments explain discharging the battery cells through resistors (e.g., heat-generating components 360 or other resistors) that are integrated with the battery pack, in some embodiments, an external resistor bank attachment may be coupled to the battery pack 105, 205, or 605 to discharge the battery pack through one or more resistors in the external resistor bank attachment. In some embodiments, the external resistor bank attachment is a cap that couples to the terminals of the battery pack. In some embodiments, the external resistor bank attachment is used to fully discharge a battery pack that has been disabled using one of the previously-described methods. For example, when a battery pack is disabled and a failure condition is indicated (e.g., by an LED, a speaker, communication to a smart phone, etc.), the external resistor bank attachment may be coupled to the battery pack to discharge the battery cells through the external resistor bank attachment. In some embodiments, isolated strings of battery cells (e.g., the bottom string of battery cells 1205 of FIG. 12) are discharged through the external resistor bank attachment. For example, the processor of the battery pack may determine that the external resistor bank attachment is coupled to the battery pack (e.g., by identifying a known resistance of the external resistor bank attachment, by communicating with a processor of the external resistor bank attachment, etc.). After the other strings of battery cells (e.g., the top two strings of battery cells 1205 in FIG. 12) in the battery pack are discharged as explained previously, the processor of the battery pack may reconnect the isolated string or strings of battery cells such that the previously-isolated strings of battery cells are able to discharge through the external resistor bank attachment.

In some embodiments, the battery pack 105, 205, and 605 may additionally or alternatively shut down upon determining that a failure condition of the battery pack exists based on additional characteristics than those described above. The processor of the battery pack may shut down or prevent operation of the battery pack (e.g., by controlling a switch that prevents current from flowing from the battery cells to an attached device such as a power tool). In other embodiments, the processor of the battery pack may communicate to a processor of an attached device (e.g., a power tool, a charger, etc.) that the battery pack should not be used. In some embodiments, the processor of the battery pack may shut down the battery pack in response to, for example, an over-temperature determination (e.g., the temperature of the battery pack exceeds a predetermined threshold), an over-charge determination (e.g., the state of charge of the battery pack exceeds a predetermined threshold), an under-temperature determination (e.g., the temperature of the battery pack is below a predetermined threshold), and an undercharge determination (e.g., the state of charge of the battery pack is below a predetermined threshold).

Accordingly, in some embodiments, the processor of the battery pack 105, 205, and 605 determines different types of failure conditions and executes different amelioration techniques based on the determined type of failure condition. For example, the battery pack may shut down to prevent operation in response to an over-temperature, overcharge, under-temperature, or undercharge condition of the battery pack. Continuing this example, the battery pack may discharge one or more strings of battery cells through internal or external resistors or by isolating one or more strings of battery cells in response to an over-temperature condition of an individual battery cell (or group of battery cells) or detection of conductive ingress fluid within the battery pack.

Although the invention has been described in detail with reference to certain preferred embodiments, variations and modifications exist within the scope and spirit of one or more independent aspects of the invention as described.

What is claimed is:

1. A battery pack comprising:
   a housing;
   a battery cell supported in the housing and electrically connectable to an electrical device, power being transferrable between the battery cell and the electrical device;
   a heating element supported in the housing and operable to provide heat to the battery cell;
   a temperature sensing device supported in the housing and operable to sense a temperature of an interior of the battery pack;
   a heating switch operable to control whether power is provided to the heating element;
   a charging switch operable to control whether power is provided to the battery cell; and
   an electronic processor coupled to the temperature sensing device and the heating switch and programmed to receive a signal from the temperature sensing device, the signal indicating the temperature of the interior of the battery pack, determine that the temperature of the interior of the battery pack is less than a predetermined temperature threshold, in response to determining that the temperature of the interior of the battery pack is less than the predetermined temperature threshold, close the heating switch to provide power to the heating element, in response to determining that the temperature of the interior of the battery pack is less than the predetermined temperature threshold, open the charging switch to prevent power from being provided to the battery cell from the charger, determine that the temperature of the interior of the battery pack is greater than or equal to the predetermined temperature threshold, and in response to determining that the temperature of the interior of the battery pack is greater than or equal to the predetermined temperature threshold, close the charging switch to provide power to the battery cell from the charger.

2. The battery pack of claim 1, wherein the battery cell is operable to power the heating element.

3. The battery pack of claim 2, further comprising an ambient air sensor operable to determine a temperature outside the housing of the battery pack; wherein the electronic processor is coupled to the ambient air sensor and is further programmed to receive a second signal from the ambient air sensor, the second signal indicating the temperature outside the housing of the battery pack, determine that the temperature outside the housing of the battery pack is less than at least one of the predetermined temperature threshold or a second predetermined temperature threshold, and in response to determining that the temperature outside the housing of the battery pack is less than at least one of the predetermined temperature threshold or the second predetermined temperature threshold, close the heating switch to provide power to the heating element from the battery cell.

4. The battery pack of claim 1, wherein the battery pack is electrically coupled to a charger, the charger being operable to power the heating element.

5. The battery pack of claim 1, further comprising a second charging switch in series with the charging switch, wherein the charging switch and the second charging switch are field-effect transistors (FETs) and a source of the charging switch is coupled to a source of the second charging switch such that the second charging switch has an opposite orientation of the charging switch.

6. The battery pack of claim 1, wherein the electronic processor is further programmed to, in response to determining that the temperature of the interior of the battery pack is greater than or equal to the predetermined temperature threshold, open the heating switch to prevent power from being provided to the heating element.

7. The battery pack of claim 1, wherein the electronic processor is further programmed to determine that the heating switch has failed, and perform at least one of opening the charging switch to prevent power from being able to be provided to the battery cell, or controlling an indicator to illuminate.

8. The battery pack of claim 1, further comprising:

a charging fuse between the battery cell and the charging switch; and a heating fuse between the heating switch and the heating element.

9. The battery pack of claim 1, further comprising:

a case within the housing supporting the battery cell, the case including a hole allowing the temperature sensing device to monitor the temperature of the interior of the battery pack; and a printed circuit mounted on the case.

10. The battery pack of claim 9, wherein the heating element is in contact with a side surface of the battery cell, the heating element being on one side of a plane through the battery cell and the temperature sensing device being on an opposite side of the plane.

11. The battery pack of claim 1, wherein the heating element includes at least one of a resistor, a carbon fiber, a resistive heating coil, a rubber jacket holding the battery cell, a heating pad underneath or between a row of battery cells, an embedded heating element within a case that holds the battery cell, or a positive temperature coefficient (PTC) thermistor.

12. The battery pack of claim 1, wherein the heating element provides heat to a reservoir of at least one of wax, mineral oil, or water contacting an outer surface of the battery cell.

13. A method of heating a battery cell, the battery cell being supported in a housing of a battery pack and electrically connectable to an electrical device, power being transferrable between the battery cell and the electrical device based on a state of a charging switch, the method comprising:

monitoring, with a temperature sensing device supported in the housing, a temperature of an interior of the battery pack;

receiving, with an electronic processor, a signal from the temperature sensing device, the signal indicating the temperature of the interior of the battery pack;

determining, with the electronic processor, that the temperature of the interior of the battery pack is less than a predetermined temperature threshold;

controlling, with the electronic processor and in response to determining that the temperature of the interior of the battery pack is less than the predetermined temperature threshold, a heating switch to close to provide power to a heating element supported in the housing, the heating element being operable to heat the battery cell;

controlling, with the electronic processor and in response to determining that the temperature of the interior of the battery pack is less than the predetermined temperature threshold, the charging switch to open to prevent power from being provided to the battery cell from a charger;

determining, with the electronic processor, that the temperature of the interior of the battery pack is greater than or equal to the predetermined temperature threshold; and controlling, with the electronic processor and in response to determining that the temperature of the interior of the battery pack is greater than or equal to the predetermined temperature threshold, the charging switch to close to provide power to the battery cell from the charger.

14. The method of claim 13, further comprising:

receiving, with the electronic processor, a second signal from an ambient air sensor, the second signal indicating a temperature outside the housing of the battery pack;

determining, with the electronic processor, that the temperature outside the housing of the battery pack is less than at least one of the predetermined temperature threshold or a second predetermined temperature threshold; and controlling, with the electronic processor and in response to determining that the temperature outside the housing of the battery pack is less than at least one of the predetermined temperature threshold or the second predetermined temperature threshold, the heating switch to close to provide power to the heating element from the battery cell.

15. The method of claim 13, further comprising controlling, with the electronic processor and in response to determining that the temperature of the interior of the battery pack is greater than or equal to the predetermined temperature threshold, the heating switch to open to prevent power from being provided to the heating element.

\* \* \* \* \*